(12) United States Patent
Akimoto et al.

(10) Patent No.: US 9,171,882 B2
(45) Date of Patent: Oct. 27, 2015

(54) SEMICONDUCTOR LIGHT EMITTING DEVICE AND LIGHT EMITTING MODULE

(71) Applicant: Kabushiki Kaisha Toshiba, Minato-ku (JP)

(72) Inventors: Yosuke Akimoto, Kanagawa-ken (JP); Yoshiaki Sugizaki, Kanagawa-ken (JP); Akihiro Kojima, Kanagawa-ken (JP); Kazuhito Higuchi, Kanagawa-ken (JP); Hideo Nishiuchi, Hyogo-ken (JP); Susumu Obata, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/176,721

(22) Filed: Feb. 10, 2014

(65) Prior Publication Data

US 2014/0175471 A1 Jun. 26, 2014

Related U.S. Application Data

(63) Continuation of application No. PCT/JP2012/001804, filed on Mar. 14, 2012.

(30) Foreign Application Priority Data

Aug. 8, 2011 (JP) ................... 2011-172875

(51) Int. Cl.
*H01L 29/205* (2006.01)
*H01L 33/00* (2010.01)
(Continued)

(52) U.S. Cl.
CPC ............ *H01L 27/153* (2013.01); *H01L 27/156* (2013.01); *H01L 33/0079* (2013.01);
(Continued)

(58) Field of Classification Search
CPC ............... H01L 51/50; H01L 2924/12041; H01L 2924/12044; H01L 27/153; H01L 27/156; H01L 33/54; H01L 33/62; H01L 33/505
USPC .......................................................... 257/91
See application file for complete search history.

(56) References Cited

U.S. PATENT DOCUMENTS 8,110,421 B2  2/2012 Sugizaki et al.
8,148,183 B2  4/2012 Hamasaki et al.
(Continued)

FOREIGN PATENT DOCUMENTS

JP  2000-244012  9/2000
JP  2002-118293  4/2002
(Continued)

OTHER PUBLICATIONS

Taiwanese Office Action issued Mar. 10, 2014, in Taiwan Patent Application No. 101109505 (with English Translation).
(Continued)

*Primary Examiner* — Nicholas Tobergte
(74) *Attorney, Agent, or Firm* — Oblon, McClelland, Maier & Neustadt, L.L.P.

(57) ABSTRACT

According to one embodiment, a semiconductor light emitting device includes a plurality of chips, a first insulating layer provided between the chips, one p-side external terminal, and one n-side external terminal. Each of the chips includes a semiconductor layer, a p-side electrode, and an n-side electrode. Each of the chips is separated from each other. The one p-side external terminal is provided corresponding to one chip on the second face side. The p-side external terminal is electrically connected to the p-side electrode. The one n-side external terminal is provided corresponding to one chip on the second face side. The n-side external terminal is electrically connected to the n-side electrode.

39 Claims, 13 Drawing Sheets

(51) Int. Cl.
*H01L 27/15* (2006.01)
*H01L 33/54* (2010.01)
*H01L 33/62* (2010.01)
*H01L 51/50* (2006.01)
*H01L 25/075* (2006.01)
*H01L 33/50* (2010.01)

(52) U.S. Cl.
CPC ................ *H01L33/54* (2013.01); *H01L 33/62* (2013.01); *H01L 25/0753* (2013.01); *H01L 33/505* (2013.01); *H01L 51/50* (2013.01); *H01L 2224/24* (2013.01); *H01L 2924/12041* (2013.01); *H01L 2924/12044* (2013.01); *H01L 2933/005* (2013.01); *H01L 2933/0066* (2013.01)

(56) References Cited

U.S. PATENT DOCUMENTS

| | | |
|---|---|---|
| 8,278,676 B2 | 10/2012 | Kojima et al. |
| 8,288,843 B2 | 10/2012 | Kojima et al. |
| 8,319,246 B2 | 11/2012 | Sugizaki |
| 8,350,285 B2 | 1/2013 | Sugizaki et al. |
| 8,367,523 B2 | 2/2013 | Sugizaki et al. |
| 8,368,089 B2 | 2/2013 | Kojima et al. |
| 8,373,192 B2 | 2/2013 | Sugizaki et al. |
| 8,377,726 B2 | 2/2013 | Kojima et al. |
| 8,378,377 B2 | 2/2013 | Sugizaki et al. |
| 8,399,275 B2 | 3/2013 | Akimoto et al. |
| 8,436,378 B2 | 5/2013 | Kojima et al. |
| 8,445,916 B2 | 5/2013 | Kojima et al. |
| 8,502,260 B2 | 8/2013 | Sugizaki |
| 8,581,291 B2 | 11/2013 | Shimokawa et al. |
| 2002/0020058 A1* | 2/2002 | Saito et al. ....................... 29/840 |
| 2009/0309209 A1 | 12/2009 | Chen |
| 2010/0148198 A1* | 6/2010 | Sugizaki et al. ................. 257/98 |
| 2011/0204396 A1 | 8/2011 | Akimoto et al. |
| 2011/0220931 A1 | 9/2011 | Kojima |
| 2011/0284910 A1 | 11/2011 | Iduka et al. |
| 2011/0291148 A1 | 12/2011 | Sugizaki et al. |
| 2011/0297965 A1 | 12/2011 | Akimoto et al. |
| 2011/0297980 A1 | 12/2011 | Sugizaki et al. |
| 2011/0297995 A1 | 12/2011 | Akimoto et al. |
| 2011/0297997 A1 | 12/2011 | Izuka et al. |
| 2011/0297998 A1 | 12/2011 | Akimoto et al. |
| 2011/0298001 A1 | 12/2011 | Akimoto et al. |
| 2011/0300651 A1 | 12/2011 | Kojima et al. |
| 2012/0086026 A1 | 4/2012 | Engl et al. |
| 2013/0320383 A1 | 12/2013 | Izuka et al. |

FOREIGN PATENT DOCUMENTS

| | | |
|---|---|---|
| JP | 2003-110148 A | 4/2003 |
| JP | 2008-523637 A | 7/2008 |
| JP | 2010-141176 A | 6/2010 |
| TW | 200534335 | 10/2005 |
| TW | 201104914 A1 | 2/2011 |
| WO | WO 2006/035664 A1 | 4/2006 |
| WO | 2011/093405 | 8/2011 |

OTHER PUBLICATIONS

Office Action issued Jul. 11, 2014 in Japanese Patent Application No. 2011-172875 (with English language translation).
Office Action issued Jul. 11, 2014 in Taiwanese Patent Application No. 101109505 with English language translation.
International Search Report issued Nov. 12, 2012 in PCT/JP2012/001804, filed Mar. 14, 2012.

* cited by examiner

SEMICONDUCTOR LIGHT EMITTING DEVICE AND LIGHT EMITTING MODULE

CROSS-REFERENCE TO RELATED APPLICATION

This is a continuation application of International Application PCT/JP2012/001804, filed on Mar. 14, 2012; the entire contents of which are incorporated herein by reference. This application also claims priority to Japanese Application No. 2011-172875, filed on Aug. 8, 2011. The entire contents of each are incorporated herein by reference.

FIELD

Embodiments of the invention relates to a semiconductor light emitting device and a light emitting module.

BACKGROUND

In a structure in which a semiconductor light emitting device is flip-chip mounted on a mounting substrate, due to the difference in thermal expansion coefficients between a semiconductor layer and the mounting substrate, the influence of stress on the semiconductor layer is a concern.

DETAILED DESCRIPTION

Figure 1A:
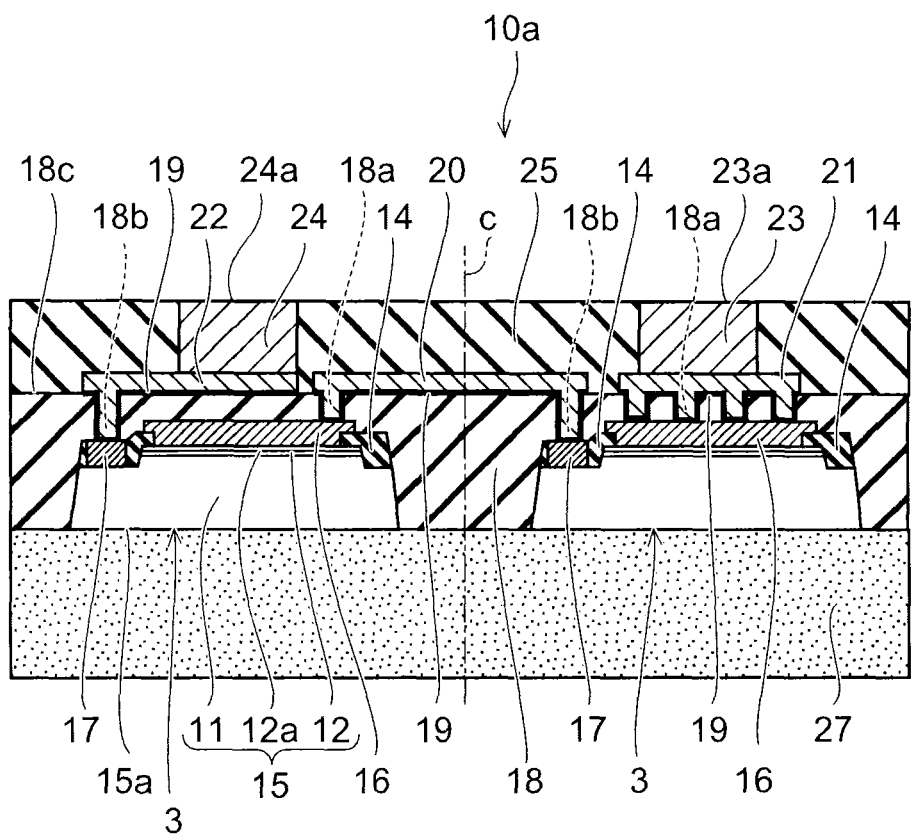
FIG. 1A is a schematic cross-sectional view of a semiconductor light emitting device of a first embodiment.

According to one embodiment, a semiconductor light emitting device includes a plurality of chips, a first insulating layer provided between the chips, one p-side external terminal, and one n-side external terminal. Each of the chips includes a semiconductor layer, a p-side electrode, and an n-side electrode. The semiconductor layer has a first face, a second face opposite to the first face, and a light emitting layer. The p-side electrode is provided on the second face. The n-side electrode is provided on the second face. Each of the chips is separated from each other. The one p-side external terminal is provided corresponding to one chip on the second face side. The p-side external terminal is electrically connected to the p-side electrode. The one n-side external terminal is provided corresponding to one chip on the second face side. The n-side external terminal is electrically connected to the n-side electrode.

Embodiments of the invention will now be described with reference to the drawings. In each of the drawings, the same components are marked with like reference numerals.

First Embodiment

FIG. 1A is a schematic cross-sectional view of a semiconductor light emitting device 10a of a first embodiment. The semiconductor light emitting device 10a has a multi-chip structure including a plurality of chips 3. The plurality of chips 3 are separated from one another. Each chip 3 has a semiconductor layer 15, a p-side electrode 16, and an n-side electrode 17.

The semiconductor layer 15 has a first face 15a, and a second face formed on the side opposite to the face 15a. A p-side electrode 16 and an n-side electrode 17 are provided on the second face, and light is mainly emitted to the outside from the first face 15a opposite to the second face.

Furthermore, the semiconductor layer 15 has a first semiconductor layer 11 and a second semiconductor layer 12. The first semiconductor layer 11 and the second semiconductor layer 12 contain, for example, gallium nitride. The first semiconductor layer 11 includes, for example, a foundation buffer layer, an n-type layer, and the like, and the n-type layer functions as a lateral current pathway. The second semiconductor layer 12 has a stacked structure in which a light emitting layer (an active layer) 12a is sandwiched by an n-type layer and a p-type layer.

The second face side of the semiconductor layer 15 is processed into a convex-concave shape. The convex part formed on the second face side includes the light emitting layer 12a. On the surface of the second semiconductor layer 12 being the surface of the convex part thereof, a p-side electrode 16 is provided. That is, the p-side electrode 16 is provided in a region having the light emitting layer 12a.

On the second face side of the semiconductor layer 15, on the side of the convex part, a region which does not have the second semiconductor layer 12 including the light emitting layer 12a is provided, and on the surface of the first semiconductor layer 11 in the region, an n-side electrode 17 is provided. That is, the n-side electrode 17 is provided in a region which does not include the light emitting layer 12a.

In the second face of the semiconductor layer 15, the area of the region including the light emitting layer 12a is larger than the area of the region which does not include the light emitting layer 12a. Moreover, the p-side electrode 16 provided in the region including the light emitting layer 12a has an area larger than an area of the n-side electrode 17 provided in the region which does not include the light emitting layer 12a. As the result, a broad light emitting region is obtained.

An insulating film 14 is provided on a side face of the second semiconductor layer 12 including the light emitting layer 12a. In addition, the insulating film 14 is provided between the p-side electrode 16 and the n-side electrode 17, and the electrodes 16 and 17 are insulated. The insulating film 14 is, for example, an inorganic insulating film such as a silicon oxide film or a silicon nitride film.

The second face side of the chip 3 is covered with a first insulating layer (hereinafter, simply referred to as an insulating layer) 18. The first face 15a is not covered with the insulating layer 18. In addition, the insulating layer 18 is filled in between the chip 3 and the chip 3 to cover the side face of the chip 3.

The side face continuing from the first face 15a in the semiconductor layer 15 is covered with the insulating layer 18. The face of the insulating layer 18 filled in between the chip 3 and the chip 3 (the lower face in FIG. 1A) is approximately flush with the first face 15a.

The insulating layer 18 is, for example, of a resin such as polyimide excellent in patterning properties of micro openings. Or, as the insulating layer 18, inorganic materials such as silicon oxide or silicon nitride may be used.

In the insulating layer 18, a first via 18a reaching the p-side electrode 16 and a second via 18b reaching the n-side electrode 17 are formed. And, the insulating layer 18 has a wiring face 18c on the side opposite to the chip 3.

On the wiring face 18c, a p-side wiring layer 21 and an n-side wiring layer 22 are provided, separated from each other. The p-side wiring layer 21 is provided, for example, on the chip 3 of the right side in FIG. 1A. The n-side wiring layer 22 is provided, for example, on the chip 3 of the left side in FIG. 1A.

On the inside wall of the first via 18a and the surface of the wiring face 18c in the vicinity thereof, a metal film 19 is formed. The p-side wiring layer 21 is, as described later, formed by a plating method using the metal film 19 as a seed metal. Accordingly, the p-side wiring layer 21 is formed in the first via 18a via the metal film 19, and is electrically connected to the p-side electrode 16 through the part provided in the first via 18a.

The p-side wiring layer 21 is thicker than the metal film 19. The p-side wiring layer 21 extends on the p-side electrode 16 of the chip 3, for example, on the right side in FIG. 1A.

On the inside wall of the second via 18b and the surface of the wiring face 18c on the chip 3 on the left side in FIG. 1A, the metal film 19 is formed. The n-side wiring layer 22 is formed, as described later, by a plating method using the metal film 19 as a seed metal. Accordingly, the n-side wiring layer 22 is formed in the second via 18b via the metal film 19, and is electrically connected to the n-side electrode 17 through the part provided in the second via 18b.

The n-side wiring layer 22 is thicker than the metal film 19. The n-side wiring layer 22 extends on the chip 3, for example, on the left side in FIG. 1A.

And, on the wiring face 18c between the p-side wiring layer 21 and the n-side wiring layer 22, a wiring layer 20 is provided. The wiring layer 20, too, is formed by a plating method using the metal film 19 of the foundation as a seed metal. The wiring layer 20 is electrically connected to the p-side electrode 16 of the chip 3 on the left side in FIG. 1A via the first via 18a leading to the p-side electrode 16 of the chip 3 on the left side in FIG. 1A and the metal film 19 formed on the inside wall thereof.

And, the wiring layer 20 is electrically connected to the n-side electrode 17 of the chip 3 on the right side in FIG. 1A via the second via 18b leading to the n-side electrode 17 of the chip 3 on the right side in FIG. 1A and the metal film 19 formed on the inside wall thereof.

Accordingly, two adjacent chips 3 shown in FIG. 1A are connected in series via the wiring layer 20. The wiring layer 20 is thicker than the metal film 19. The wiring layer 20 extends on the wiring face 18c between the adjacent chips 3.

The metal films 19 formed under each of the p-side wiring layer 21, the n-side wiring layer 22 and the wiring layer 20 are separated from one another on the wiring face 18c.

On the face opposite to the chip 3 in the p-side wiring layer 21, a p-side metal pillar 23 is provided. The p-side wiring layer 21, the metal film 19 being the foundation thereof, and the p-side metal pillar 23 constitute a p-side wiring part in the embodiment.

On the face of the side opposite to the chip 3 in the n-side wiring layer 22, an n-side metal pillar 24 is provided. The n-side wiring layer 22, the metal film 19 being the foundation thereof, and the n-side metal pillar 24 constitute an n-side wiring part in the embodiment.

The p-side metal pillar 23 is thicker than the p-side wiring layer 21, and the n-side metal pillar 24 is thicker than the n-side wiring layer 22. The p-side metal pillar 23 is provided on the chip 3, for example, on the right side in FIG. 1A, and the n-side metal pillar 24 is provided on the chip 3, for example, on the left side.

On the wiring face 18c of the insulating layer 18, a resin layer 25 is provided as a second insulating layer. The resin layer 25 covers the p-side wiring layer 21, the n-side wiring layer 22 and the wiring layer 20. Moreover, the resin layer 25 is filled in between the p-side metal pillar 23 and the n-side metal pillar 24.

The resin layer 25 covers the side face of the p-side metal pillar 23 and the side face of the n-side metal pillar 24. The face opposite to the p-side wiring layer 21 in the p-side metal pillar 23 is not covered with the resin layer 25 but is exposed, and functions as a p-side external terminal 23a. The face opposite to the n-side wiring layer 22 in the n-side metal pillar 24 is not covered with the resin layer 25 but is exposed, and functions as an n-side external terminal 24a. That is, the p-side external terminal 23a and the n-side external terminal 24a are exposed on the side opposite to the first face 15a while sandwiching the second face of the semiconductor layer 15.

Figure 1B:
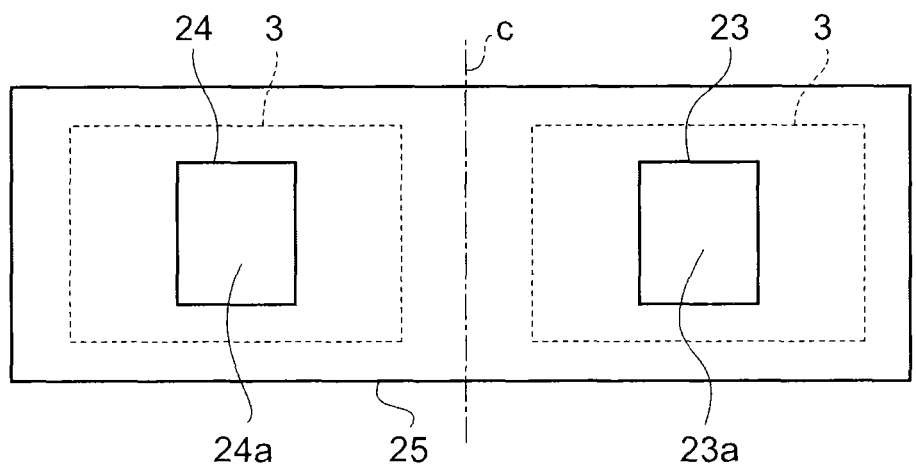
FIG. 1B shows a schematic plan view of the semiconductor light emitting device of a first embodiment.

FIG. 1B shows a schematic plan view on the mounting face side of the semiconductor light emitting device 10a. Dashed one-dotted lines in FIGS. 1A and 1B show the center line c passing through the middle point between the p-side external terminal 23a and the n-side external terminal 24a. That is, the center line c bisects the part between the p-side external terminal 23a and the n-side external terminal 24a in the direction connecting between the terminals 23a and 24a. And, the center line c is perpendicular to a line joining the p-side external terminal 23a and the n-side external terminal 24a, and to the light emitting face of the light emitting layer 12a. In the embodiment, the center line c is positioned between adjacent chips 3, and no semiconductor layer 15 is provided on the center line c.

As shown in FIG. 1B, the metal pillar provided corresponding to one chip 3 is one, and a plurality of metal pillars are not laid out on one chip 3. Accordingly, no semiconductor layer 15 exists on the center line c between adjacent metal pillars.

As described later, the semiconductor layer 15 is formed on a substrate suitable for the epitaxial growth of the semiconductor layer 15, but the substrate is removed from on the first face 15a. As the result, the height of the semiconductor light emitting device 10a can be reduced.

On the first face 15a and on the insulating layer 18 between chips 3, a fluorescent body layer 27 is provided as a transparent body transparent to the light emitted from the light emitting layer 12a. Or, as the transparent body, a lens may be provided.

The fluorescent body layer 27 includes a transparent resin, and fluorescent body particles dispersed in the transparent resin. The fluorescent body particle can absorb the emitted light from the light emitting layer 12a to emit a wavelength-converted light. As the result, the semiconductor light emitting device 10a may emit a mixed light of the light from the light emitting layer 12a and the wavelength-converted light by the fluorescent body layer 27.

For example, when the light emitting layer 12a is of a GaN-based material and the fluorescent body particle is of a yellow fluorescent body emitting yellow light, as a mixed light of blue light from the light emitting layer 12a and the yellow light being the wavelength-converted light by the fluorescent body layer 27, white color, electric bulb color, or the like can be obtained. Meanwhile, the fluorescent body layer 27 may have a configuration including plural types of fluorescent body particles (for example, a red fluorescent body particle emitting red light, and a green fluorescent body particle emitting green light).

Figure 2:
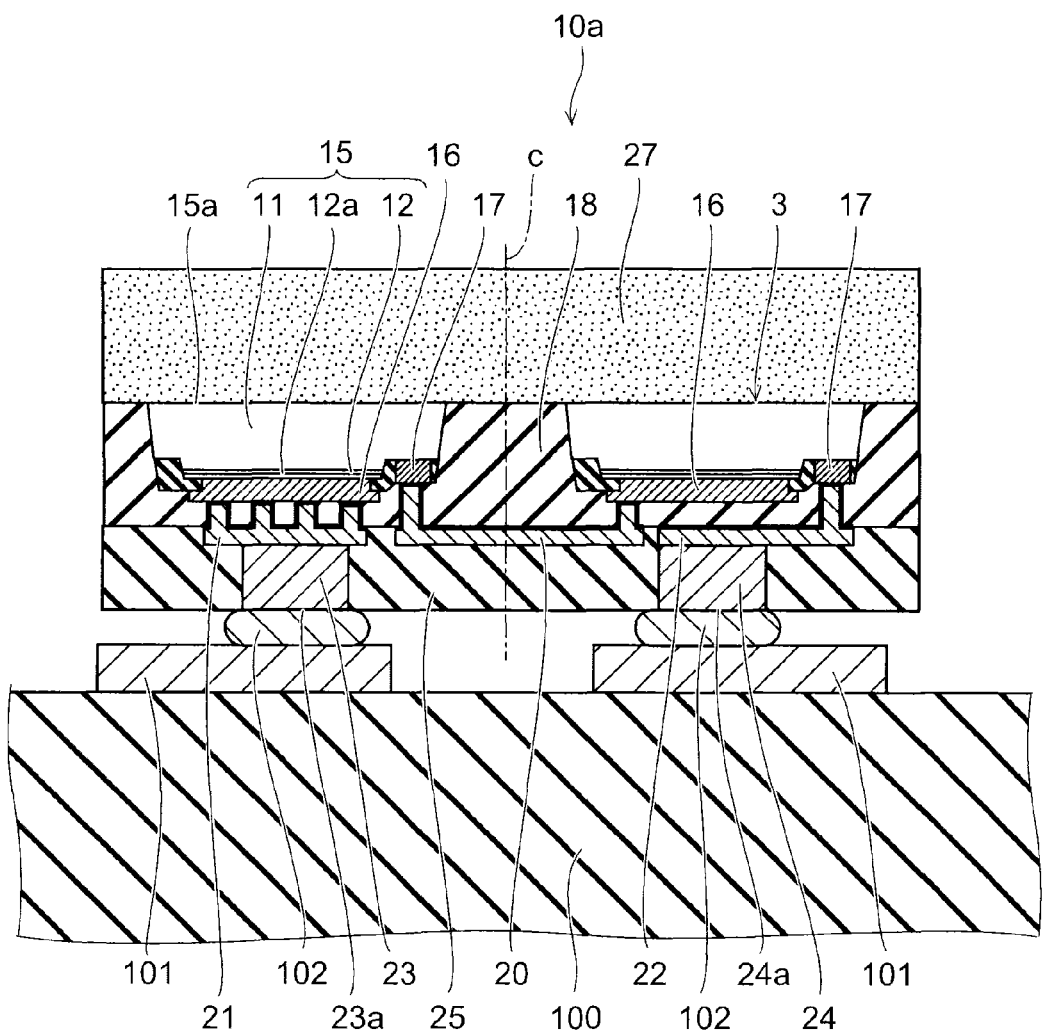
FIG. 2 is a schematic cross-sectional view of a semiconductor light emitting module of a first embodiment.

FIG. 2 is a schematic cross-sectional view of a light emitting module having a configuration in which the semiconductor light emitting device 10a of the first embodiment is mounted on a mounting substrate 100.

The number of the semiconductor light emitting device 10a to be mounted on the mounting substrate 100 is arbitrary, and may be singular or plural. And, a plurality of semiconductor light emitting devices 10a may be aligned along a certain direction to constitute a linear light source.

Each of the p-side external terminal 23a and the n-side external terminal 24a of the semiconductor light emitting device 10a is joined to a pad 101 formed on the surface (a mounting face) of the mounting substrate 100 via a solder 102. A wiring pattern is also formed on the mounting face of the mounting substrate 100, and the pad 101 is connected to the wiring pattern. Instead of the solder 102, a metal other than the solder may be used.

The first face 15a faces the side opposite to the mounting face (the upper side in FIG. 2), and the light is mainly emitted toward the side opposite to the mounting face (the upper side in FIG. 2).

In the embodiment, the stress added to the chip 3 from the mounting substrate 100 side in a state where the semiconductor light emitting device 10a is mounted on the mounting substrate 100, can be absorbed by the p-side metal pillar 23, the n-side metal pillar 24 and the resin layer 25 to be relaxed. In particular, the resin layer 25 has flexibility as compared with a metal, and thus a high stress relaxation effect can be obtained.

Moreover, in the state where the semiconductor light emitting device 10a is mounted on the mounting substrate 100, the difference in thermal expansion coefficients of the semiconductor layer 15 and the mounting substrate 100 may become problematic.

For example, the thermal expansion coefficient of a GaN layer in a face direction is 5.59 (ppm/° C.), the thermal expansion coefficient of the GaN layer in the thickness direction is 3.17 (ppm/° C.), the thermal expansion coefficient of a glass cloth/glass nonwoven cloth composite epoxy resin stacked plate (CEM-3: Composite epoxy material-3) is 16 (ppm/° C.), the thermal expansion coefficient of an aluminum substrate is 23 (ppm/° C.), and the thermal expansion coefficient of an AlN substrate is 4.5 (ppm/° C.).

The difference in thermal expansion coefficients of the semiconductor layer 15 and the mounting substrate 100 may generate a stress causing the p-side external terminal 23a and the n-side external terminal 24a which are constrained to the mounting substrate 100 by the solder 102 and the pad 101, to be separated from each other. Accordingly, a tensile stress is liable to concentrate near the aforementioned center line c between the p-side external terminal 23a and the n-side external terminal 24a in the semiconductor light emitting device 10a, and if the semiconductor layer 15 exists present there, there is a concern that cracks are generated in the semiconductor layer 15.

In the embodiment, no semiconductor layer 15 exists on the center line c between the p-side external terminal 23a and the n-side external terminal 24a on which the stress is liable to act. Accordingly, it is possible to avoid the concentration of stress added to the semiconductor layer 15, and to prevent the semiconductor layer 15 from cracking.

At the crossing part of the center line c and an extension line of the semiconductor layer 15 in a face direction, an insulating layer 18 is provided as a layer having a rigidity lower than the rigidity of the semiconductor layer 15. The insulating layer 18 is a resin layer more flexible than the semiconductor layer 15 and a metal. That is, near the center line c between the p-side external terminal 23a and the n-side external terminal 24a where the stress is liable to concentrate, the resin layer 25 and the insulating layer 18 made of a resin are provided. That is, since the resin more flexible than the semiconductor layer 15 and the metal is provided at a part where the stress is liable to concentrate, the resin absorbs the stress and a high stress relaxation effect can be obtained. As the result, the reliability of the chip 3 can be enhanced.

The first semiconductor layer 11 is electrically connected to the n-side metal pillar 24 including the n-side external terminal 24a via the n-side electrode 17 and the n-side wiring layer 22. The second semiconductor layer 12 including the light emitting layer 12a is electrically connected to the p-side metal pillar 23 including the p-side external terminal 23a via the p-side electrode 16 and the p-side wiring layer 21. And, a plurality of chips 3 are connected in series by the wiring layer 20. That is, a plurality of chips 3 are connected in series between the p-side external terminal 23a and the n-side external terminal 24a. Or, a plurality of chips 3 may be connected in parallel between the p-side external terminal 23a and the n-side external terminal 24a.

A broader area of the p-side wiring layer 21 makes it possible to supply a current with more uniform distribution to the second semiconductor layer 12 including the light emitting layer 12a, and in addition, makes it also possible to allow heat to escape effectively from the light emitting layer 12a.

The p-side electrode 16 extends into a light emitting region including the light emitting layer 12a. Accordingly, by connecting the p-side wiring layer 21 and the p-side electrode 16 via a plurality of first vias 18a, the current distribution to the light emitting layer 12a is improved, and heat releasing properties of the light emitting layer 12a can also be improved.

The area of the n-side wiring layer 22 is larger than the area of the n-side electrode 17. In addition, the area of the n-side wiring layer 22 extending on the insulating layer 18 is larger than the area where the n-side wiring layer 22 is connected to the n-side electrode 17 through the second via 18b.

By the light emitting layer 12a formed over a region broader than the n-side electrode 17, high light output can be obtained. And in addition, a structure can be realized in which the n-side electrode 17 which does not include the light emitting layer 12a and which is provided in a region narrower than the light emitting region is rearranged on the mounting face side as the n-side wiring layer 22 with an area broader than the n-side electrode 17.

The area where the p-side wiring layer 21 contacts the p-side metal pillar 23 is sometimes larger than the area where the p-side wiring layer 21 contacts the p-side electrode 16, or sometimes smaller.

Each of the p-side metal pillar 23, the n-side metal pillar 24, and the resin layer 25 has a thickness larger than the thickness of the semiconductor layer 15, and, furthermore, larger than the thickness of the chip 3. Accordingly, even when a substrate to be described later used for forming the semiconductor layer 15 is omitted, it is possible to support stably the semiconductor layer 15 by a support including the p-side metal pillar 23, the n-side metal pillar 24 and the resin layer 25, and to enhance the mechanical strength of the semiconductor light emitting device 10a.

The aspect ratio (the ratio of the thickness relative to the plane size) of each of metal pillars 23 and 24 is not limited to be not less than 1, but may be less than 1. That is, metal pillars 23 and 24 may have a thickness smaller than the plane size thereof.

As the material of the p-side wiring layer 21, the n-side wiring layer 22, the p-side metal pillar 23 and the n-side metal pillar 24, copper, gold, nickel, silver etc. can be used. Among these, through the use of copper, give good thermal conductivity, high migration resistance and excellent adhesion to an insulating material can be obtained.

As the resin layer 25, the use of a layer having a coefficient of thermal expansion the same as or close to the coefficient of the mounting substrate 100 is desirable. Examples of such resin layer 25 can include a layer of epoxy resin, silicone resin, fluorine-containing resin, or the like.

Next, with reference to FIGS. 3A to 5B, a manufacturing method of the semiconductor light emitting device 10a is explained.

Figure 3A:
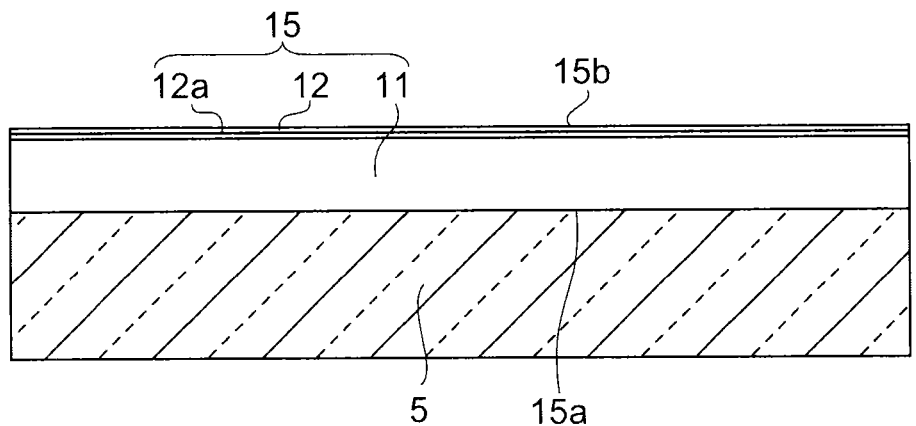
FIGS. 3A to 5B are schematic cross-sectional views showing a manufacturing method of a semiconductor light emitting device of a first embodiment.

FIG. 3A shows a stacked body forming the first semiconductor layer 11 and the second semiconductor layer 12 on the main face of the substrate 5.

On the main face of the substrate 5, the first semiconductor layer 11 is formed, and, on the layer 11, the second semiconductor layer 12 including the light emitting layer 12a is formed. Crystals of the first semiconductor layer 11 and the second semiconductor layer 12 including gallium nitride can be grown, for example, on a sapphire substrate by a metal organic chemical vapor deposition (MOCVD) method.

The first semiconductor layer 11 includes a foundation buffer layer and an n-type GaN layer. The second semiconductor layer 12 includes a light emitting layer (an active layer) 12a and a p-type GaN layer. As the light emitting layer 12a, a layer emitting blue, violet, blue-violet, ultraviolet light or the like may be used.

A face contacting to the substrate 5 in the first semiconductor layer 11 is a first face 15a of the semiconductor layer 15, and a face of the second semiconductor layer 12 on the opposite side thereof is a second face 15b of the semiconductor layer 15.

Figure 3B:
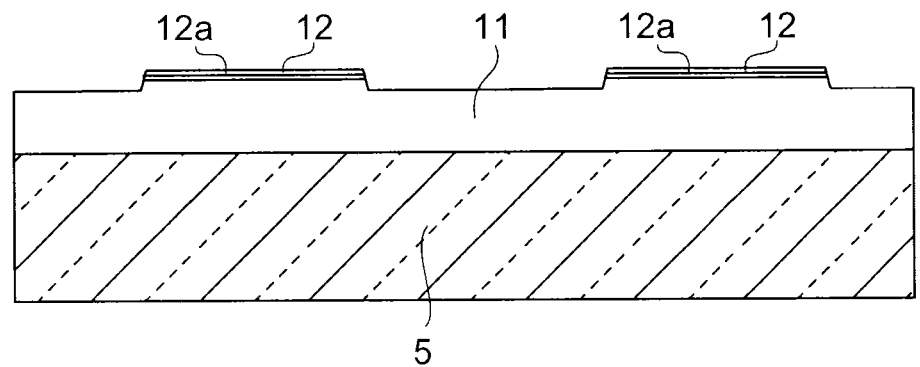

After forming the semiconductor layer 15 on the substrate 5, for example, by a Reactive Ion Etching (RIE) method using a resist (not shown), as shown in FIG. 3B, a part of the second semiconductor layer 12 is removed to expose a part of the first semiconductor layer 11. The region where the first semiconductor layer 11 is exposed does not include the light emitting layer 12a.

Figure 4A:
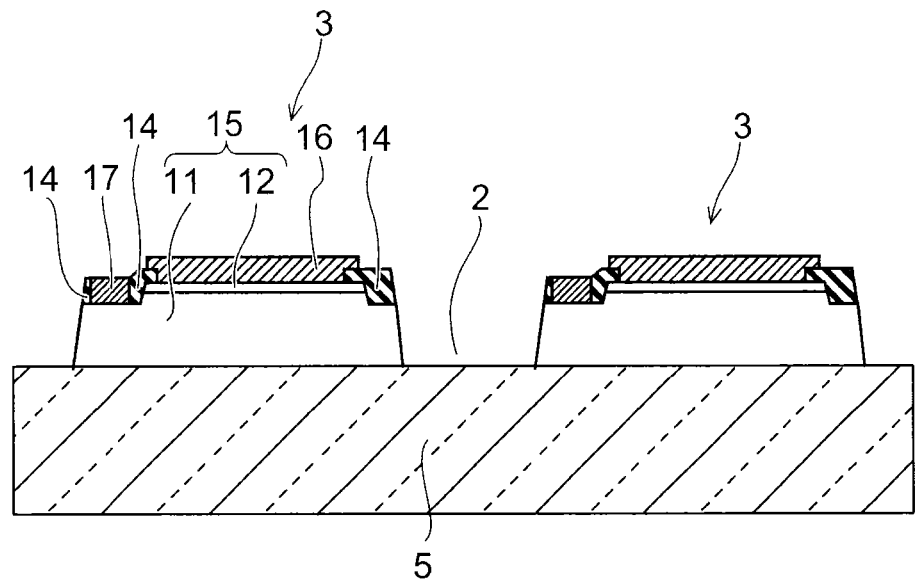

Next, as shown in FIG. 4A, on the face of the second semiconductor 12, a p-side electrode 16 is formed, and, on the face of the first semiconductor layer 11, an n-side electrode 17 is formed. The p-side electrode 16 and the n-side electrode 17 are formed, for example, by a sputtering method, evaporation method or the like. Either the p-side electrode 16 or the n-side electrode 17 may be formed first, or both may be formed simultaneously with the same material. An activation annealing or the like for achieving an ohmic contact between electrodes 16 and 17, and semiconductor layers 11 and 12, respectively, or the like is performed according to need.

The second face of the semiconductor layer 15 on which the p-side electrode 16 and the n-side electrode 17 are not formed is covered with the insulating film 14. The insulating film 14 covers and protects a side face of the second semiconductor layer 12 including the light emitting layer 12a.

Next, for example, by an RIE method using a resist (not shown) as a mask, the insulating film 14 and the first semiconductor layer 11 are removed selectively to form a trench 2 reaching the substrate 5. The trench 2 is formed, for example, in a lattice-like planar layout on the substrate 5 of a wafer state. By the trench 2, the semiconductor layer 15 is separated into a plurality of chips 3 on the substrate 5. Meanwhile, the process of separating the semiconductor layer 15 into a plural number may be performed before the formation of the electrodes 16 and 17.

Figure 4B:
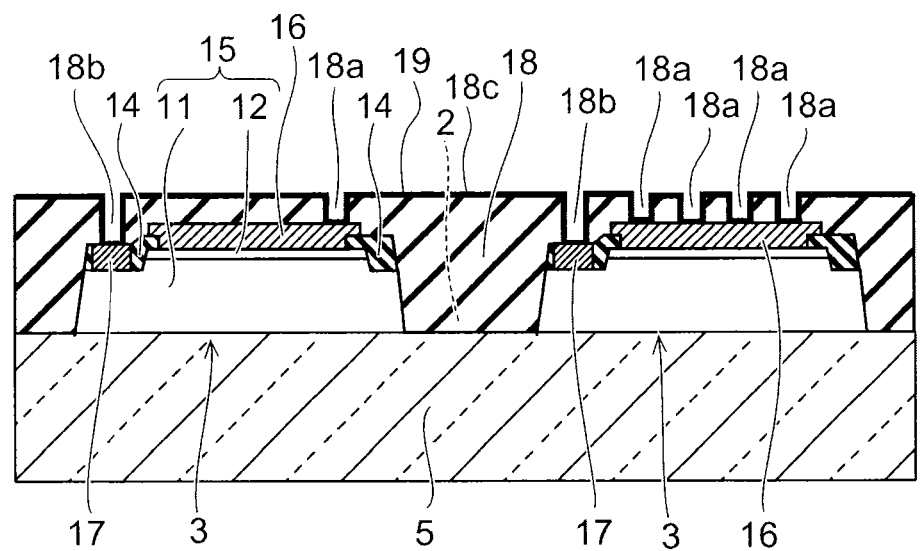

Next, all the exposed parts on the substrate 5 are covered with an insulating layer 18 shown in FIG. 4B. The insulating layer 18 is provided on the p-side electrode 16 and on the n-side electrode 17. Moreover, the insulating layer 18 is also provided in the trench 2, and covers a side face of the first semiconductor layer 11 continuing from the first face 15a.

Next, the insulating layer 18 is etched selectively to form a first via 18a and a second via 18b in the insulating layer 18. The first via 18a reaches the p-side electrode 16. The second via 18b reaches the n-side electrode 17. And, the face opposite to the chip 3 in the insulating layer 18 becomes a wiring face 18c to be described later on which a wiring layer is formed.

Next, on the wiring face 18c, and on the inside wall of first via 18a and the inside wall of the second via 18b, a metal film 19 is formed. The metal film 19 is used as a seed metal of plating to be described later. The metal film 19 is also formed on the surface of the p-side electrode 16 exposed at the bottom part of the first via 18a, and on the surface of the n-side electrode 17 exposed at the bottom part of the second via 18b.

The metal film 19 is formed, for example, by a sputtering method. The metal film 19 includes, for example, a stacked film of titanium (Ti) and copper (Cu) formed in order from the lower layer side.

Figure 5A:
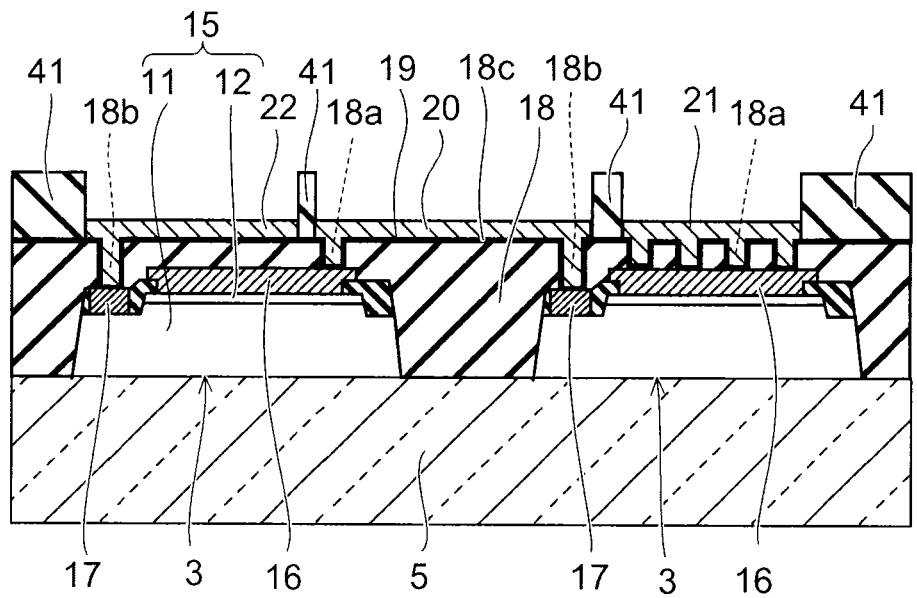

Next, as shown in FIG. 5A, a resist 41 is selectively formed on the metal film 19, and Cu electrolytic plating using the metal film 19 as a current pathway is performed. As the result, on the metal film 19, the p-side wiring layer 21, the n-side wiring layer 22 and the wiring layer 20 are formed selectively.

The p-side wiring layer 21 is also formed in a plurality of first vias 18a of the chip 3 on the right side in FIG. 5A, and is electrically connected to the p-side electrode 16 of the chip 3 on the right side via the metal film 19.

The n-side wiring layer 22 is also formed in the second via 18b of the chip 3 on the left side in FIG. 5A, and is electrically connected to the n-side electrode 17 of the chip 3 on the left side via the metal film 19.

The wiring layer 20 is formed on the wiring face 18c between the p-side wiring layer 21 and the n-side wiring layer 22. Moreover, the wiring layer 20 is also formed in the first via 18a of the chip 3 on the left side in FIG. 5A, and is electrically connected to the p-side electrode 16 of the chip 3 on the left side via the metal film 19. Furthermore, the wiring layer 20 is also formed in the second via 18b of the chip 3 on the right side in FIG. 5A, and is electrically connected to the n-side electrode 17 of the chip 3 on the right side via the metal film 19.

Figure 5B:
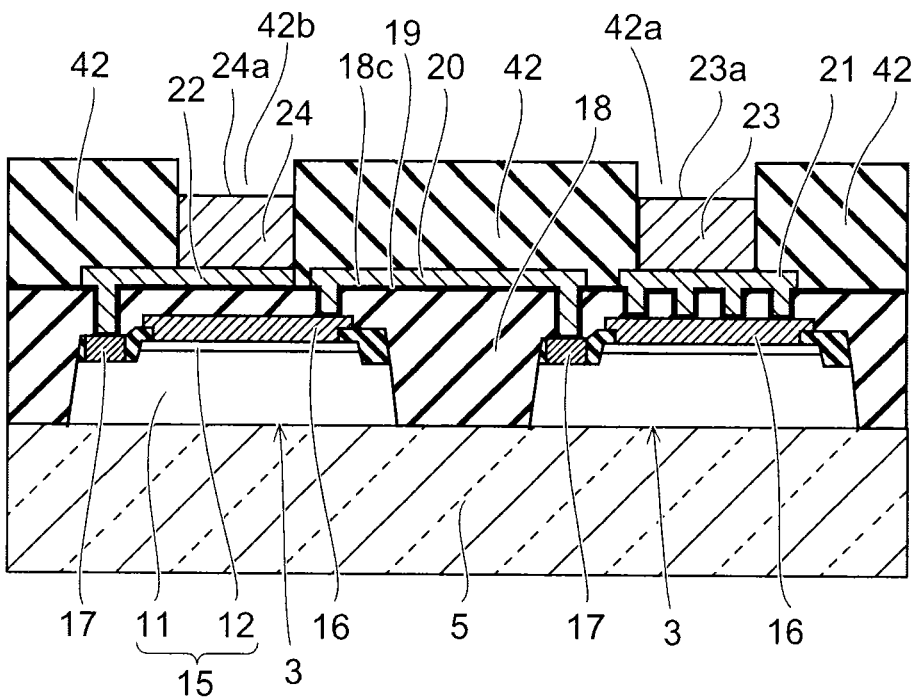

Next, as shown in FIG. 5B, a resist 42 is formed on the wiring face 18c. For the resist 42, a first opening 42a leading to the p-side wiring layer 21, and a second opening 42b leading to the n-side wiring layer 22 are formed selectively.

And, using the resist 42 as a mask, the Cu electrolytic plating using the metal film 19 as a current pathway is performed. As the result, the p-side metal pillar 23 and the n-side metal pillar 24 are formed. The p-side metal pillar 23 is formed on the p-side wiring layer 21. The n-side metal pillar 24 is formed on the n-side wiring layer 22.

After forming the p-side metal pillar 23 and the n-side metal pillar 24, the resist 42 is removed. After that, the exposed part of the metal film 19 is removed. As the result, the metal film 19 linked between the p-side wiring layer 21, the n-side wiring layer 22 and the wiring layer 20 is divided into sections as shown in FIG. 1A.

Next, a resin layer 25 (shown in FIG. 1A) filled in between wiring layers and between metal pillars is formed. The resin layer 25 has insulating properties. And, the resin layer 25 may be incorporated, for example, with carbon black to be given light-shielding properties for the light emitted from the light emitting layer 12a. And, the resin layer 25 may be incorporated with powder having a reflectivity for the light emitted from the light emitting layer 12a.

In a state where the chip 3 is supported by a support including the p-side metal pillar 23, the n-side metal pillar 24 and the resin layer 25, the substrate 5 used for forming the semiconductor layer 15 is removed, for example, by a laser liftoff method.

From the rear face side of the substrate 5, the first semiconductor layer 11 is irradiated with laser light. The laser light has a permeability to the substrate 5, and has a wavelength which becomes an absorption region for the first semiconductor layer 11.

When the laser light reaches the interface between the substrate 5 and the first semiconductor layer 11, the first semiconductor layer 11 near the interface absorbs the energy of the laser light to decompose. For example, the first semiconductor layer 11 of a GaN-based material decomposes to gallium (Ga) and nitrogen gas. The decomposition reaction forms a minute gap between the substrate 5 and the first semiconductor layer 11 to separate the substrate 5 and the first semiconductor layer 11. The whole wafer divided in a plurality of times for every preset region is irradiated with the laser light, and thus the substrate 5 is removed.

Since the semiconductor layer 15 is supported by a support thicker than this, even when the substrate 5 is eliminated, the wafer state may be maintained. And, the resin layer 25, a metal constituting the p-side metal pillar 23 and the n-side metal pillar 24 are also made of a material more flexible as compared with the semiconductor layer 15. As the result, event when a large internal stress generated in the epitaxial growth forming the semiconductor layer 15 on the substrate 5 is released at once at the ablation of the substrate 5, the destruction of the device can be avoided.

After removing the substrate 5, the first face 15a is subjected to cleaning, or, as necessary, to a frost treatment for forming irregularity. The formation of minute irregularity on the first face 15a can improve a light extraction efficiency. After that, the fluorescent body layer 27 (shown in FIG. 1A) is formed on the first face 15a.

A process of forming the fluorescent body layer 27 has, for example, a process of supplying a transparent resin in liquid form dispersed with fluorescent body particles onto the first face 15a by a method of printing, potting, molding, compression molding or the like, and a process of thermally curing the same.

After forming the fluorescent body layer 27, the wafer is cut in a dicing region to be separated into a plurality of semiconductor light emitting devices 10a. On this occasion, since the hard substrate 5 has already been removed, the substrate 5 is not required to be separated to make the separation easy.

And, in the dicing region, no chip 3 including the semiconductor layer 15 is formed, but the resin layer 25 and the insulating layer 18 are provided. That is, since no semiconductor layer 15 exists in the dicing region, damage that might be given to the semiconductor layer 15 in dicing can be avoided. In the dicing region, a wiring layer and a metal pillar do not exist, too.

Since each process until before the dicing is performed collectively in a wafer state, there is no such a need as forming the wiring part including the external terminal and protecting the chip with an insulating material for every separated device, to make considerable reduction of production cost possible. That is, in the separated state, as shown in FIG. 1A, the side face of the chip 3 has already been covered and protected with the insulating film 14 and the insulating layer 18. As the result, the productivity can be enhanced and the price reduction becomes easy.

Second Embodiment

Figure 6:
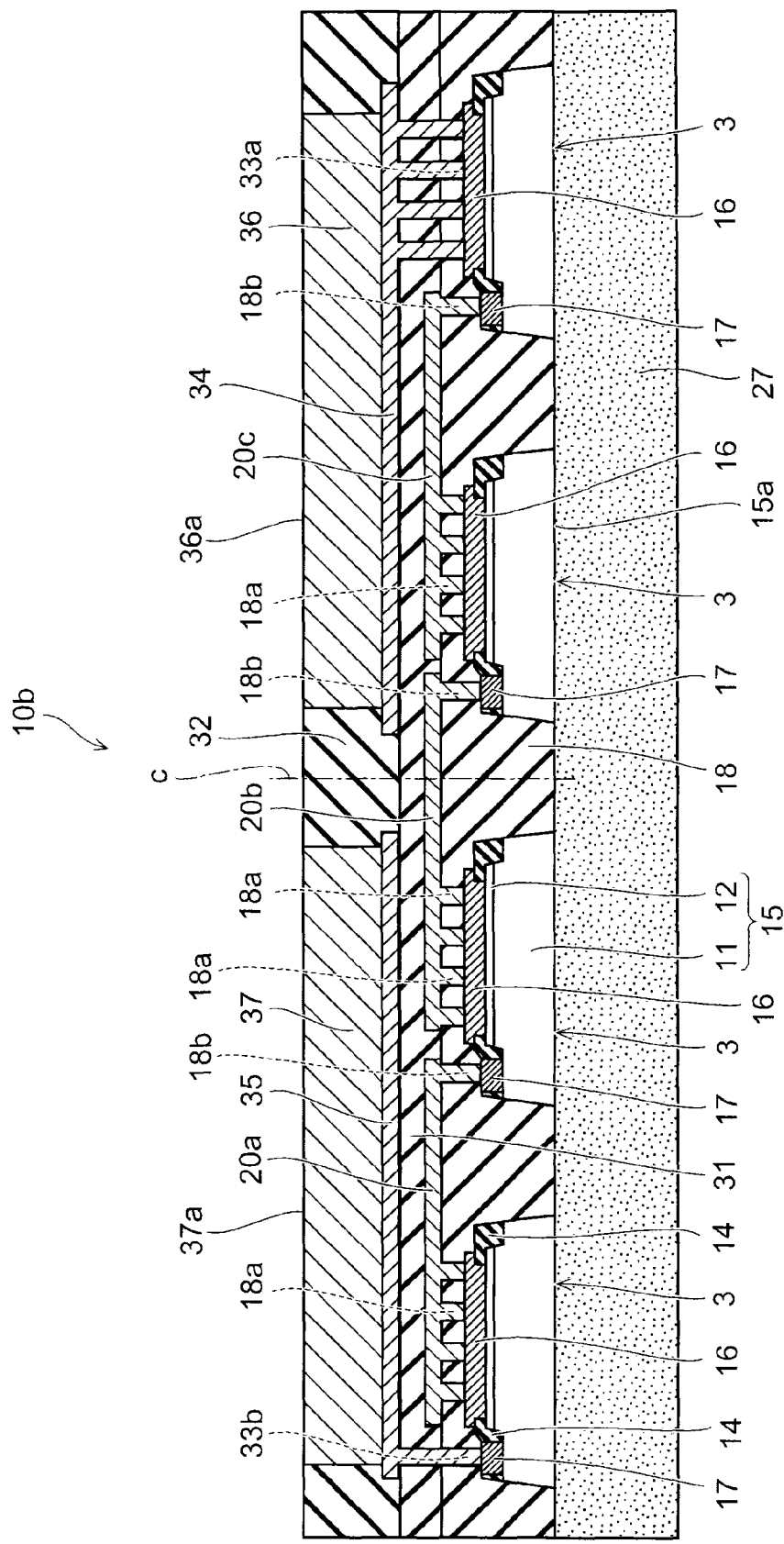
FIG. 6 is a schematic cross-sectional view of a semiconductor light emitting device of a second embodiment.

FIG. 6 is a schematic cross-sectional view of a semiconductor light emitting device 10b of a second embodiment.

Figure 7:
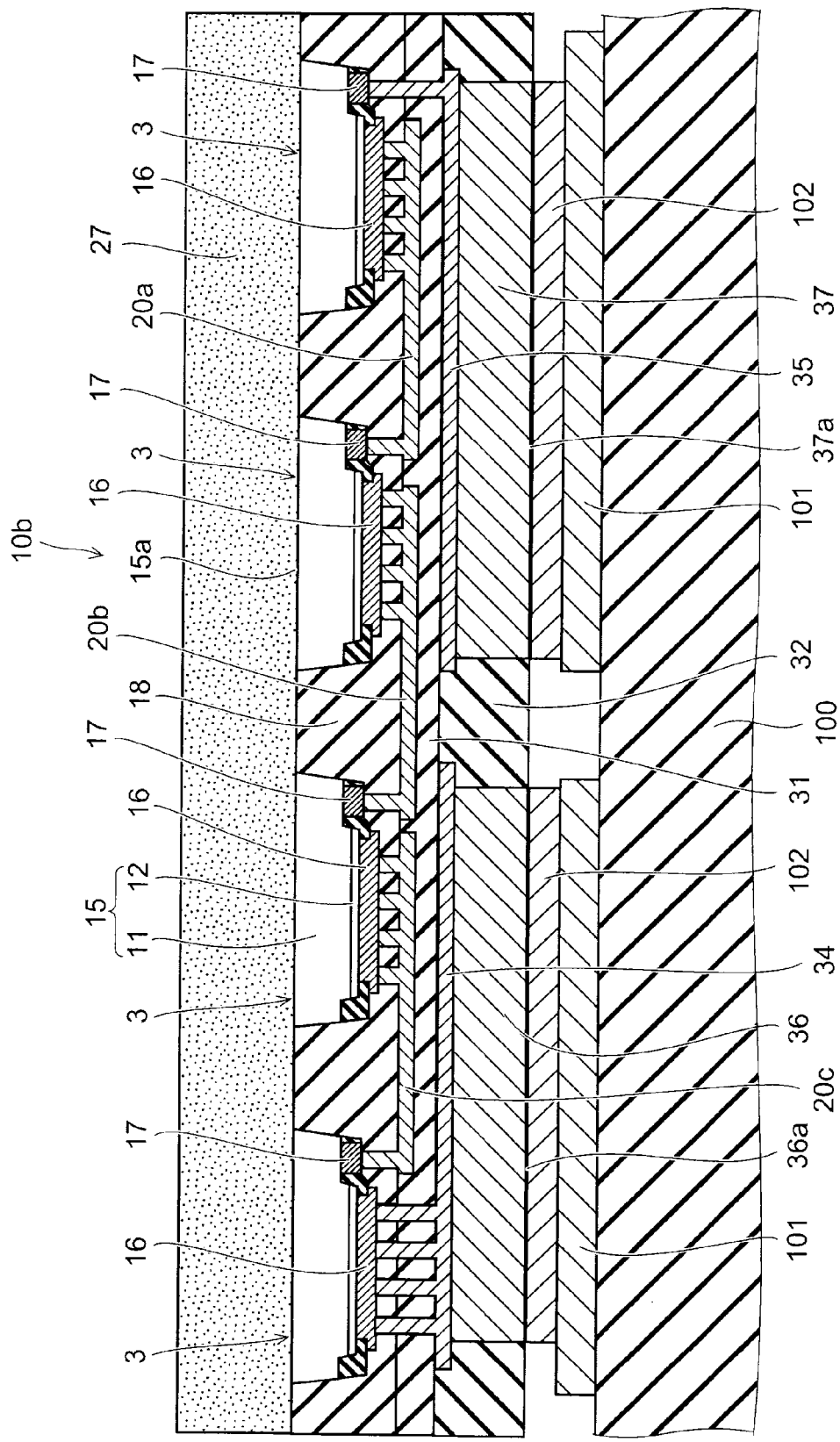
FIG. 7 is a schematic cross-sectional view of a semiconductor light emitting module of a second embodiment.

FIG. 7 is a schematic cross-sectional view of a light emitting module having a configuration in which the semiconductor light emitting device 10b of the second embodiment is mounted on a mounting substrate 100.

The semiconductor light emitting device 10b of the embodiment also has a multi-chip structure including a plurality of chips 3. Although in the cross-section shown in FIG. 6, for example, four chips 3 are shown, the number of the chip 3 is not limited to this, but is arbitrary. The configuration of each of chips 3 is the same as the configuration in the first embodiment.

In the same manner as in the first embodiment, on the second face side of each chip 3 and between respective chips 3, an insulating layer 18 is provided. In the insulating layer 18, a first via 18a reaching the p-side electrode 16 and a second via 18b reaching the n-side electrode 17 are formed.

On the insulating layer 18, wiring layers 20a, 20b and 20c are formed, separated from each other. The wiring layers 20a, 20b and 20c are formed simultaneously, for example, by a plating method. The representation of the metal film used as a seed metal in the plating is omitted in FIG. 6.

The wiring layer 20a is also provided in the first via 18a of the left end chip 3 in FIG. 6, and is connected to the p-side electrode 16 of the left end chip 3. Moreover, the wiring layer 20a is also provided in the second via 18b of the second chip 3 from the left in FIG. 6, and is connected to the n-side electrode 17 of the second chip 3 from the left.

The wiring layer 20b is also provided in the first via 18a of the second chip 3 from the left in FIG. 6, and is connected to the p-side electrode 16 of the second chip 3 from the left. Moreover, the wiring layer 20b is also provided in the second via 18b of the third chip 3 from the left in FIG. 6, and is connected to the n-side electrode 17 of the third chip 3 from the left.

The wiring layer 20c is also provided in the first via 18a of the third chip 3 from the left in FIG. 6, and is connected to the p-side electrode 16 of the third chip 3 from the left. Moreover, the wiring layer 20c is also provided in the second via 18b of the right end chip 3 in FIG. 6, and is connected to the n-side electrode 17 of the right end chip 3.

Accordingly, a plurality of chips 3 are connected in series by the wiring layers 20a, 20b and 20c.

On the insulating layer 18, so as to cover the wiring layers 20a, 20b and 20c, an insulating layer 31 is provided. As to the insulating layer 31, the same material as the material of the insulating layer 18 can be used. For example, as the insulating layer 31, resin such as polyimide can be used.

On the insulating layer 31, a p-side wiring layer 34 and an n-side wiring layer 35 are formed, separated from each other. The p-side wiring layer 34 and the n-side wiring layer 35 are formed simultaneously, for example, by a plating method. The representation of a metal film used as a seed metal in the plating is omitted in FIG. 6.

The p-side wiring layer 34 is connected, via a plurality of vias 33a passing through the insulating layer 31 and the insulating layer 18 to reach the p-side electrode 16 of the right end chip 3 in FIG. 6, with the p-side electrode 16 of the right end chip 3.

The n-side wiring layer 35 is connected, via a via 33b passing through the insulating layer 31 and the insulating layer 18 to reach the n-side electrode 17 of the left end chip 3 in FIG. 6, with the n-side electrode 17 of the left end chip 3.

On the face opposite to the chip 3 in the p-side wiring layer 34, a p-side metal pillar 36 is provided. The p-side wiring layer 34 and the p-side metal pillar 36 constitute a p-side wiring part in the embodiment. The p-side metal pillar 36 is thicker than the p-side wiring layer 34.

On the face opposite to the chip 3 in the n-side wiring layer 35, an n-side metal pillar 37 is provided. The n-side wiring layer 35 and the n-side metal pillar 37 constitute an n-side wiring part in the embodiment. The n-side metal pillar 37 is thicker than the n-side wiring layer 35.

On the insulating layer 31, a resin layer 32 is provided as a second insulating layer in the embodiment. The resin layer 32 is filled in between the p-side wiring layer 34 and the n-side wiring layer 35, and in between the p-side metal pillar 36 and the n-side metal pillar 37. The resin layer 32 covers a side face of the p-side wiring layer 34, a side face of the n-side wiring layer 35, a side face of the p-side metal pillar 36, and a side face of the n-side metal pillar 37.

The face opposite to the p-side wiring layer 34 in the p-side metal pillar 36 is not covered with the resin layer 32 but is exposed, and functions as a p-side external terminal 36a. The face opposite to the n-side wiring layer 35 in the n-side metal pillar 37 is not covered with the resin layer 32 but is exposed, and functions as an n-side external terminal 37a.

Each of the p-side wiring layer 34 and the n-side wiring layer 35 extends on a region including a plurality of chips 3. For example, the p-side wiring layer 34 extends on a region including right two chips 3 in FIG. 6, and the n-side wiring layer 35 extends on a region including left two chips 3 in FIG. 6.

The p-side metal pillar 36 provided on the p-side wiring layer 34 also extends on a region including a plurality of chips 3. Accordingly, the p-side external terminal 36a also extends on a region including a plurality of chips 3. For example, the p-side external terminal 36a extends on a region including right two chips 3 in FIG. 6.

The n-side metal pillar 37 provided on the n-side wiring layer 35 also extends on a region including a plurality of chips 3. Accordingly, the n-side external terminal 37a also extends on a region including a plurality of chips 3. For example, the n-side external terminal 37a extends on a region including left two chips 3 in FIG. 6.

In FIG. 6, a dashed one-dotted line shows the center line c passing through the middle point between the p-side external terminal 36a and the n-side external terminal 37a. The center line c bisects a part between the p-side external terminal 36a and the n-side external terminal 37a in a direction connecting the terminals 36a and 37a. Moreover, the center line c is perpendicular to a line connecting the p-side external terminal 36a and the n-side external terminal 37a, and to a light emitting face of the light emitting layer 12a. The center line c is positioned between chips 3. In an example shown in FIG. 6, the center line c is positioned between middle two chips 3. No semiconductor layer 15 is provided on the center line c.

As shown in FIG. 7, each of the p-side external terminal 36a and the n-side external terminal 37a of the semiconductor light emitting device 10b is joined to a pad 101 formed on a face of the mounting substrate 100 (a mounting face) via a solder 102. The first face 15a faces a side opposite to the mounting face (the upper side in FIG. 7), and light is mainly emitted to the side opposite to the mounting face (the upper side in FIG. 7).

Also in the embodiment, the stress added to the chip 3 from the mounting substrate 100 side in a state where the semiconductor light emitting device 10b is mounted on the mounting substrate 100 can be absorbed by the p-side metal pillar 36, the n-side metal pillar 37 and the resin layer 32 to be relaxed.

And, also in the embodiment, no semiconductor layer 15 exists on the center line c between the p-side external terminal 36a and the n-side external terminal 37a, on which the aforementioned tensile stress explained in the first embodiment is liable to concentrate. Accordingly, it is possible to avoid the concentration of stress added to the semiconductor layer 15, and to prevent the semiconductor layer 15 from cracking.

At the crossing part of the center line c and an extension line of the semiconductor layer 15 in the face direction, an insulating layer 18 is provided as a layer having a rigidity lower than the rigidity of the semiconductor layer 15. The insulating layer 18 is a resin layer more flexible than the semiconductor layer 15 and a metal. That is, near the center line c between the p-side external terminal 36a and the n-side external terminal 37a where the above-mentioned stress is liable to concentrate, the resin layer 32 and insulating layers 31 and 18 each including a resin is provided. That is, since the resin more flexible than the semiconductor layer 15 and the metal is provided at a part where the stress is liable to concentrate, the resin absorbs the stress to give a high effect of relaxing the stress. As the result, the reliability of the chip 3 can be enhanced.

Moreover, in the embodiment, the p-side wiring layer 34 and the n-side wiring layer 35 are formed not in the same layer as the wiring layers 20a to 20c connecting between chips 3 but on a layer above these wiring layers 20a to 20c. Therefore, the p-side wiring layer 34 and the n-side wiring layer 35 can be formed over a broad region including a plurality of chips 3.

As the result, the planar size of the p-side metal pillar 36 and the n-side metal pillar 37 provided on the p-side wiring layer 34 and the n-side wiring layer 35, respectively, can be made large. Accordingly, the area of the p-side external terminal 36a and the n-side external terminal 37a can be made broad. As the result, heat releasing properties of the light emitting layer 12a toward the mounting substrate 100 side through the p-side external terminal 36a and the n-side external terminal 37a can be enhanced. Furthermore, the junction strength between the p-side external terminal 36a and the n-side external terminal 37a, and the pad 101 is enhanced, and thus the reliability is increased.

The first semiconductor layer 11 of the left end chip 3 in FIG. 6 is electrically connected to the n-side metal pillar 37 via the n-side electrode 17 and the n-side wiring layer 35. The second semiconductor layer 12 of the right end chip 3 in FIG. 6 is electrically connected to the p-side metal pillar 36 via the p-side electrode 16 and the p-side wiring layer 34.

And, a plurality of chips 3 are connected in series between the p-side external terminal 36a and the n-side external terminal 37a by the p-side wiring layer 34, the n-side wiring layer 35 and the wiring layers 20a to 20c. Alternatively, a plurality of chips 3 may be connected in parallel between the p-side external terminal 36a and the n-side external terminal 37a.

By connecting the p-side wiring layer 34 extending over a broad area on a region including a plurality of chips 3 with the p-side electrode 16 via a plurality of vias 33a, the current distribution to the light emitting layer 12a is improved, and heat releasing properties of the light emitting layer 12a can also be improved.

The area of the n-side wiring layer 35 is larger than the area of the n-side electrode 17. Moreover, the area of the n-side wiring layer 35 extending on the insulating layer 31 is larger than the area where the n-side wiring layer 35 is connected to the n-side electrode 17 with the via 33b. Such a structure is made in which the n-side electrode 17 which does not include the light emitting layer 12a and which is provided in a region narrower than the light emitting region is rearranged on the mounting face side as the n-side wiring layer 35 with an area larger than the n-side electrode 17.

Each of the p-side metal pillar 36, the n-side metal pillar 37, and the resin layer 32 has a thickness thicker than the semiconductor layer 15, and, furthermore, than the chip 3. Accordingly, even when a substrate used for forming the semiconductor layer 15 is omitted, it is possible to support stably the semiconductor layer 15 by a support including the p-side metal pillar 36, the n-side metal pillar 37 and the resin layer 32, and to enhance the mechanical strength of the semiconductor light emitting device 10b.

As the material of the p-side wiring layer 34, the n-side wiring layer 35, the wiring layers 20a to 20c, the p-side metal pillar 36 and the n-side metal pillar 37, copper, gold, nickel, silver etc. can be used. Among these, through the use of copper, good thermal conductivity, high migration resistance and excellent adhesion to an insulating material can be obtained.

As the resin layer 32, the use of a layer having a coefficient of thermal expansion the same as or close to the coefficient of the mounting substrate 100 is desirable. Examples of such resin layer 25 can include a layer of epoxy resin, silicone resin, fluorine-containing resin, or the like.

Third Embodiment

Figure 8:
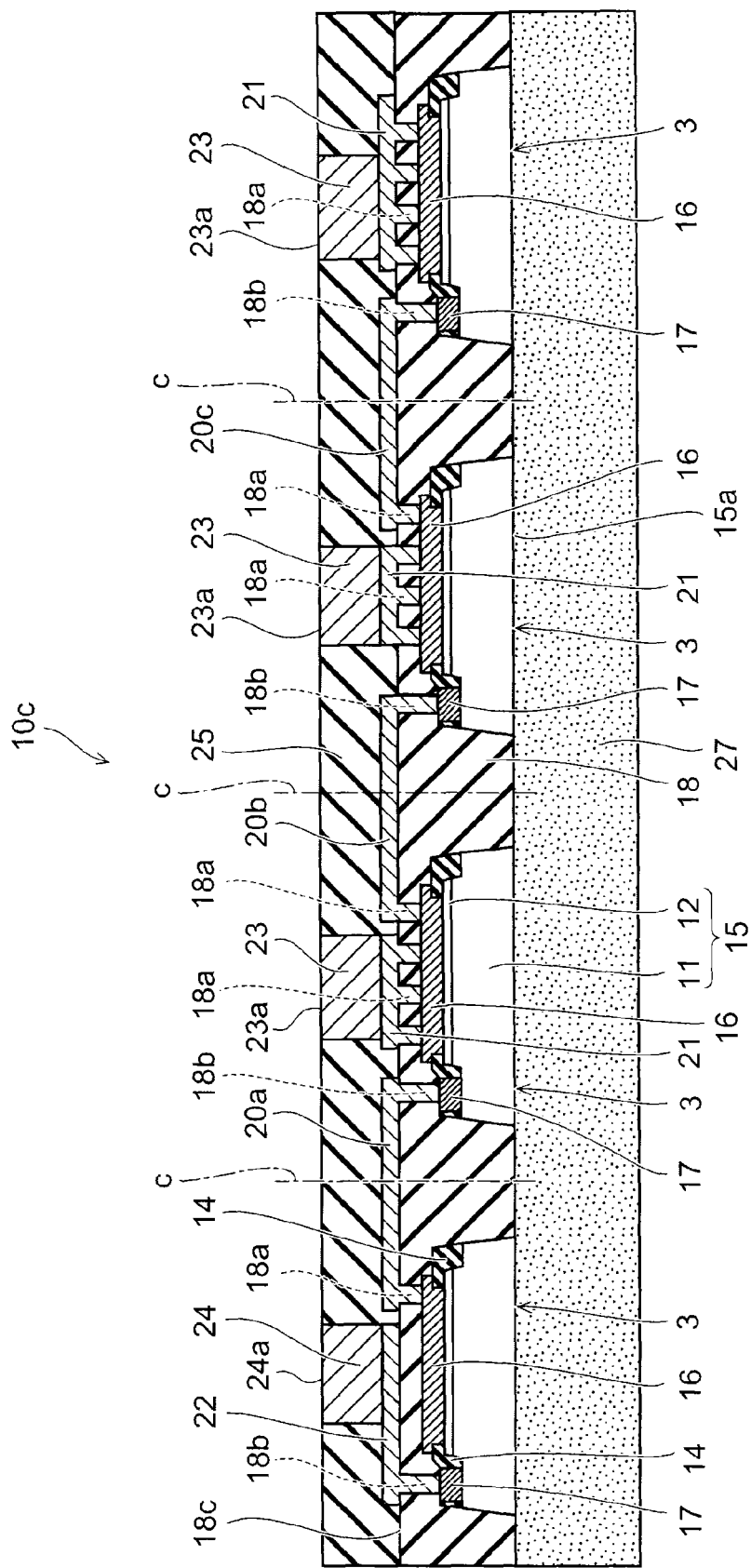
FIG. 8 is a schematic cross-sectional view of a semiconductor light emitting device of a third embodiment.

FIG. 8 is a schematic cross-sectional view of a semiconductor light emitting device 10c of a third embodiment. The semiconductor light emitting device 10c of the embodiment also has a multi-chip structure including a plurality of chips 3. Although in the cross-section shown in FIG. 8, for example, four chips 3 are shown, the number of the chip 3 is not limited to this, but is arbitrary. The construction of each of the chips 3 is the same as the construction in the first embodiment.

In the same manner as in the first embodiment, on the second face side of each chip 3 and between respective chips 3, the insulating layer 18 is provided. In the insulating layer 18, a first via 18a reaching the p-side electrode 16 and a second via 18b reaching the n-side electrode 17 are formed.

On the insulating layer 18, the p-side wiring layer 21, the n-side wiring layer 22, and the wiring layers 20a, 20b and 20c are formed, separated from each other. These wiring layers are formed simultaneously, for example, by a plating method. The representation of a metal film used as a seed metal in the plating is omitted in FIG. 8.

The p-side wiring layer 21 is also provided in the first via 18a of the right end chip 3 in FIG. 8, and is connected to the p-side electrode 16 of the right end chip 3. Moreover, the p-side wiring layer 21 is also provided in the first via 18a of the second chip 3 from the right in FIG. 8, and is connected to the p-side electrode 16 of the second chip 3 from the right. Moreover, the p-side wiring layer 21 is also provided in the first via 18a of the second chip 3 from the left in FIG. 8, and is connected to the p-side electrode 16 of the second chip 3 from the left.

The n-side wiring layer 22 is also provided in the second via 18b of the left end chip 3 in FIG. 8, and is connected to the n-side electrode 17 of the left end chip 3.

The wiring layer 20a is also provided in the first via 18a of the left end chip 3 in FIG. 8, and connected to the p-side electrode 16 of the left end chip 3. Moreover, the wiring layer 20a is also provided in the second via 18b of the second chip 3 from the left in FIG. 8, and is connected to the n-side electrode 17 of the second chip 3 from the left.

The wiring layer 20b is also provided in the first via 18a of the second chip 3 from the left in FIG. 8, and is connected to the p-side electrode 16 of the second chip 3 from the left. Moreover, the wiring layer 20b is also provided in the second via 18b of the third chip 3 from the left in FIG. 8, and is connected to the n-side electrode 17 of the third chip 3 from the left.

The wiring layer 20c is also provided in the first via 18a of the third chip 3 from the left in FIG. 8, and is connected to the p-side electrode 16 of the third chip 3 from the left. Moreover, the wiring layer 20c is also provided in the second via 18b of the right end chip 3 in FIG. 8, and is connected to the n-side electrode 17 of the right end chip 3.

Accordingly, a plurality of chips 3 are connected in series by the wiring layers 20a, 20b and 20c.

On the face opposite to the chip 3 in the p-side wiring layer 21, a p-side metal pillar 23 is provided. In the embodiment, the p-side wiring layer 21 and the p-side metal pillar 23 are provided corresponding to each of a plurality of chips 3.

On the face opposite to the chip 3 in the n-side wiring layer 22, an n-side metal pillar 24 is provided.

On the insulating layer 18, a resin layer 25 is provided. The resin layer 25 covers the p-side wiring layer 21, the n-side wiring layer 22, and the wiring layers 20a, 20b and 20c. In addition, the resin layer 25 is filled in between the p-side metal pillar 23 and the n-side metal pillar 24, and in between adjacent p-side metal pillars 23. The resin layer 25 covers a side face of the p-side metal pillar 23 and a side face of the n-side metal pillar 24.

The face opposite to the p-side wiring layer 21 in the p-side metal pillar 23 is not covered with the resin layer 25 but is exposed, and functions as a p-side external terminal 23a. The face opposite to the n-side wiring layer 22 in the n-side metal pillar 24 is not covered with the resin layer 25 but is exposed, and functions as an n-side external terminal 24a.

In FIG. 8, the dashed one-dotted line shows the center line c bisecting a part between adjacent metal pillars (external terminals) in a direction connecting between adjacent metal pillars (external terminals). Moreover, the center line c is perpendicular to a line connecting between adjacent metal pillars, and to the light emitting face of the light emitting layer 12a. The center line c is positioned between the chips 3. No semiconductor layer 15 is provided on the center line c.

Each of the p-side external terminal 23a and the n-side external terminal 24a is joined to the pad 101 formed on the surface of the mounting substrate 100 (the mounting face) via the solder 102.

Also in the embodiment, the stress added to the chip 3 from the mounting substrate 100 side in a state where the semiconductor light emitting device 10c is mounted on the mounting substrate 100 can be absorbed by the p-side metal pillar 23, the n-side metal pillar 24 and the resin layer 25 to be relaxed. Moreover, since the metal pillar is provided on all the chips 3, the stress relaxation effect by the metal pillar can be given to each of respective chips 3.

Furthermore, also in the embodiment, no semiconductor layer 15 exists on the center line c between the p-side external terminal 23a and the n-side external terminal 24a, on which the aforementioned tensile stress explained in the first embodiment is liable to concentrate. Accordingly, it is possible to avoid the concentration of stress added to the semiconductor layer 15, and to prevent the semiconductor layer 15 from cracking.

Furthermore, since no semiconductor layer 15 also exists on the center line c between adjacent p-side external terminals 23a in a plurality of p-side external terminal 23a, it is possible to avoid the concentration of stress added to the semiconductor layer 15, and to prevent the semiconductor layer 15 from cracking.

At the crossing part of the center line c and an extension line of the semiconductor layer 15 in the face direction, the insulating layer 18 is provided as a layer having a rigidity lower than the rigidity of the semiconductor layer 15. The insulating layer 18 is a resin layer more flexible than the semiconductor layer 15 and a metal. That is, near the center line c where the above-mentioned stress is liable to concentrate, the resin layer 25 and the insulating layer 18 including a resin is provided. That is, since the resin more flexible than the semiconductor layer 15 and the metal is provided at a part where the stress is liable to concentrate, the resin absorbs the stress, and thus a high stress relaxation effect can be obtained. As the result, the reliability of the chip 3 can be enhanced.

The first semiconductor layer 11 of the left end chip 3 in FIG. 8 is electrically connected to the n-side metal pillar 24 via the n-side electrode 17 and the n-side wiring layer 22. Each of the second semiconductor layers 12 of the three chips 3 other than the chip at the left end in FIG. 8 is electrically connected to the p-side metal pillar 23 via the p-side electrode 16 and the p-side wiring layer 21.

The n-side external terminal 24a may be connected to the n-side electrode 17 of at least one chip 3 among a plurality of chips 3. The p-side external terminal 23a has only to be connected to the p-side electrode 16 of at least one chip 3 among a plurality of chips 3.

By providing the p-side wiring part (the p-side wiring layer 21 and the p-side metal pillar 23) on a plurality of chips 3, as in the embodiment, heat releasing properties and the stability of the mounting can be enhanced. That is, it is possible to increase the number of heat releasing paths for discharging the heat of a light emitting region to the mounting substrate side through the p-side electrode 16, the p-side wiring layer 21 and the p-side metal pillar 23 provided on the light emitting region. In the embodiment, the metal pillar is provided on the light emitting region of all the chips 3. Accordingly, the heat of the light emitting region of respective chips 3 can be discharged to the mounting substrate side through the metal pillar provided on the light emitting region.

Moreover, a plurality of p-side external terminals 23a make it possible to secure broadly the junction area between the semiconductor light emitting device 10c and the mounting substrate, and to enhance the junction strength.

Fourth Embodiment

Figure 9:
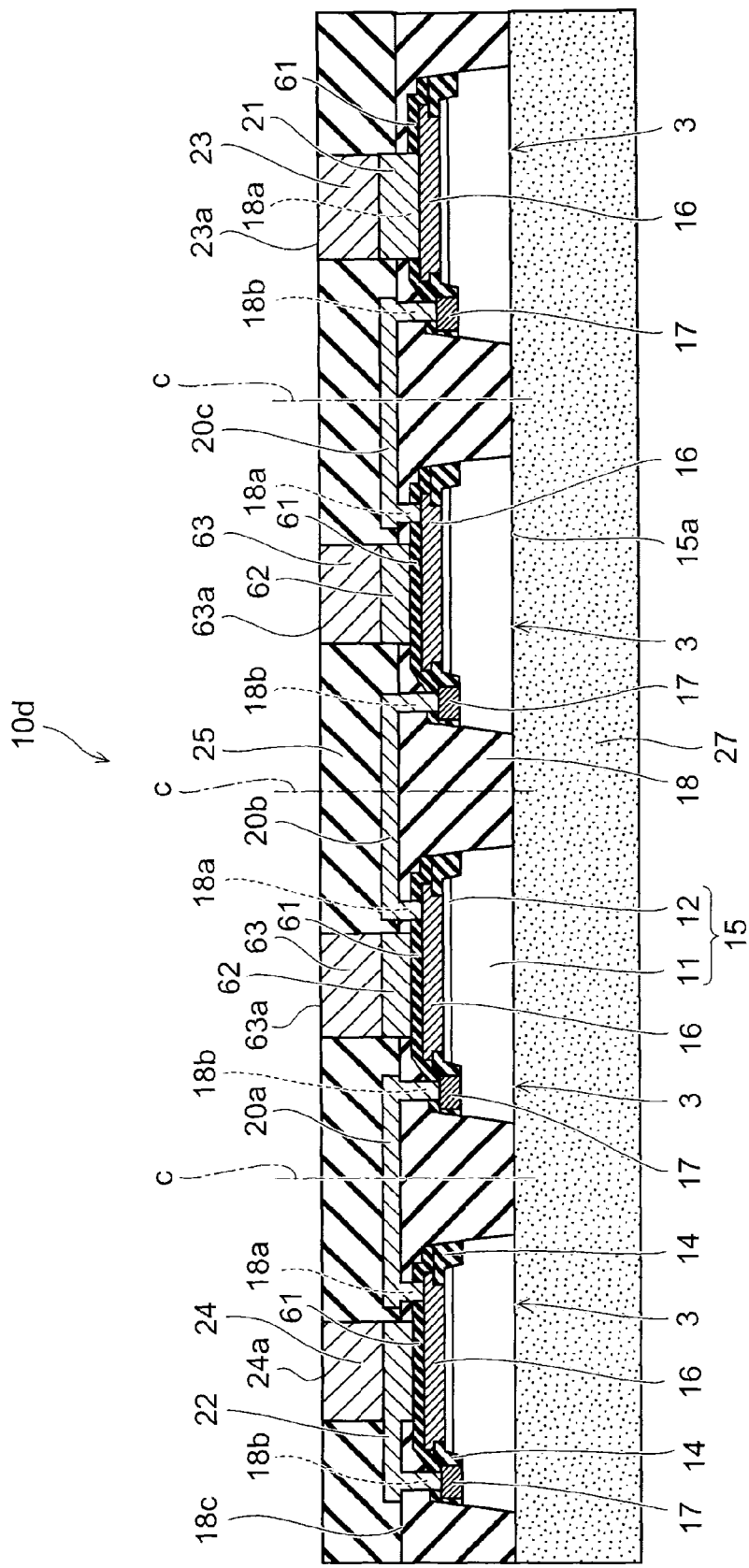
FIG. 9 is a schematic cross-sectional view of a semiconductor light emitting device of a fourth embodiment.

FIG. 9 is a schematic cross-sectional view of a semiconductor light emitting device 10d of a fourth embodiment. The semiconductor light emitting device 10d of the embodiment also has a multi-chip structure including a plurality of chips 3. Although in the cross-section shown in FIG. 9, for example, four chips 3 are shown, the number of the chip 3 is not limited to this, but is arbitrary. The configuration of each of chips 3 is the same as the configuration in the first embodiment.

Also in the embodiment, in the same manner as in the first embodiment, on the second face side of each chip 3 and between respective chips 3, an insulating layer 18 is provided. In the insulating layer 18, the first via 18a reaching the p-side electrode 16 and the second via 18b reaching the n-side electrode 17 are formed.

Moreover, in the embodiment, an inorganic insulating film 61 is provided on the p-side electrode 16. The inorganic insulating film 61 is, for example, a silicon oxide film or a silicon nitride film. The first via 18a passes through the insulating layer 18 and the inorganic insulating film 61 to reach the p-side electrode 16.

On the insulating layer 18, the p-side wiring layer 21, the n-side wiring layer 22, and the wiring layers 62, 20a, 20b and 20c are formed, separated from each other. The wiring layers are formed simultaneously, for example, by a plating method. The representation of the metal film used as a seed metal in the plating is omitted in FIG. 9.

The p-side wiring layer 21 is connected to the p-side electrode 16 of the right end chip 3, through the first via 18a passing through the insulating layer 18 and the inorganic insulating film 61 on the right end chip 3 in FIG. 9.

The n-side wiring layer 22 is provided in the second via 18b of the left end chip 3 in FIG. 9, and is connected to the n-side electrode 17 of the left end chip 3. Moreover, the n-side wiring layer 22 extends on the inorganic insulating film 61 of the left end chip 3. Since the inorganic insulating film 61 is interposed between the n-side wiring layer 22 and the p-side electrode 16 of the left end chip 3, the n-side wiring layer 22 and the p-side electrode 16 are insulated from each other in the left end chip 3.

On the inorganic insulating film 61 of each of middle two chips 3 in FIG. 9, a wiring layer 62 is provided. Since the inorganic insulating film 61 is interposed between the wiring layer 62 and the p-side electrode 16, the wiring layer 62 and the p-side electrode 16 are insulated from each other.

The wiring layer 20a is also provided in the first via 18a of the left end chip 3 in FIG. 9, and is connected to the p-side electrode 16 of the left end chip 3. Moreover, the wiring layer 20a is also provided in the second via 18b of the second chip 3 from the left in FIG. 9, and is connected to the n-side electrode 17 of the second chip 3 from the left.

The wiring layer 20b is also provided in the first via 18a of the second chip 3 from the left in FIG. 9, and is connected to the p-side electrode 16 of the second chip 3 from the left. Moreover, the wiring layer 20b is also provided in the second via 18b of the third chip 3 from the left in FIG. 9, and is connected to the n-side electrode 17 of the third chip 3 from the left.

The wiring layer 20c is also provided in the first via 18a of the third chip 3 from the left in FIG. 9, and is connected to the p-side electrode 16 of the third chip 3 from the left. Moreover, the wiring layer 20c is also provided in the second via 18b of the right end chip 3 in FIG. 9, and is connected to the n-side electrode 17 of the right end chip 3.

Accordingly, a plurality of chips 3 are connected in series by the wiring layers 20a, 20b and 20c.

On the face opposite to the chip 3 in the p-side wiring layer 21, a p-side metal pillar 23 is provided. On the face opposite to the chip 3 in the n-side wiring layer 22, an n-side metal pillar 24 is provided. On the face opposite to the chip 3 in the wiring layer 62, a metal pillar 63 is provided. The metal pillar 63 is electrically in a floating state.

On the insulating layer 18, the resin layer 25 is provided. The resin layer 25 covers the wiring layers 20a, 20b and 20c. In addition, the resin layer 25 is filled in between adjacent metal pillars and covers a side face of respective metal pillars. That is, the resin layer 25 is filled in between the n-side metal pillar 24 and the metal pillar 63, in between the metal pillar 63 and the metal pillar 63, and in between the metal pillar 63 and the p-side metal pillar 23.

The face opposite to the p-side wiring layer 21 in the p-side metal pillar 23 is not covered with the resin layer 25 but is exposed, and functions as the p-side external terminal 23a. The face opposite to the n-side wiring layer 22 in the n-side metal pillar 24 is not covered with the resin layer 25 but is exposed, and functions as the n-side external terminal 24a. Furthermore, the face opposite to the wiring layer 62 in the metal pillar 63 is also not covered with resin layer 25 but is exposed, and functions as an external terminal 63a. That is, the p-side external terminal 23a, the n-side external terminal 24a and the external terminal 63a are exposed in the same plane.

In FIG. 9, a dashed one-dotted line shows the center line c passing through the middle point bisecting a part between adjacent metal pillars (external terminals) in a direction connecting the adjacent metal pillars (external terminals). In addition, the center line c is perpendicular to a line connecting between the adjacent metal pillars, and to the light emitting face of the light emitting layer 12a. The center line c is positioned between chips 3. No semiconductor layer 15 is provided on the center line c. Furthermore, in FIG. 9, the center line lying between middle two external terminals 63a is also the center line c between the left end n-side external terminal 24a and the right end p-side external terminal 23a.

Each of the p-side external terminal 23a and the n-side external terminal 24a is joined to the aforementioned pad 101 formed on the surface (the mounting face) of the mounting substrate 100 via the solder 102. Furthermore, the external terminal 63a is also joined to the pad formed on the mounting face of the mounting substrate 100 via the solder.

Through the p-side external terminal 23a and the n-side external terminal 24a, electric power is supplied to the semiconductor light emitting device 10d, and the light emitting layer of respective chips 3 emits light. The semiconductor light emitting device 10d and the mounting substrate are also joined by the external terminal 63a, but no electric power is supplied to the external terminal 63a. Accordingly, the pad on the mounting substrate side to which the external terminal 63a is joined may be in a land pattern not connected to other wiring.

The stress added to the chip 3 from the mounting substrate side in a state where the semiconductor light emitting device 10d is mounted on the mounting substrate can be absorbed by the p-side metal pillar 23, the n-side metal pillar 24, the metal pillar 63 and the resin layer 25 to be relaxed.

In the embodiment, in addition to the p-side metal pillar 23 and the n-side metal pillar 24, the metal pillar 63 is also provided. Accordingly, the metal pillar is provided on all the chips 3. As the result, the stress relaxation effect by the metal pillar can be given to each of respective chips 3.

Moreover, the increase in the external terminal makes it possible to secure broadly the junction area between the semiconductor light emitting device 10d and the mounting substrate, and to enhance the junction strength.

Furthermore, also in the embodiment, no semiconductor layer 15 exists on the center line c between the p-side external terminal 23a and the n-side external terminal 24a, on which the aforementioned tensile stress explained in the first embodiment is liable to concentrate. Accordingly, it is possible to avoid the concentration of stress added to the semiconductor layer 15, and to prevent the semiconductor layer 15 from cracking.

Moreover, since no semiconductor layer 15 also exists on the center line c between the n-side external terminal 24a and the external terminal 63a, on the center line c between the external terminal 63a and the external terminal 63a, and on the center line c between the external terminal 63a and the p-side external terminal 23a, it is possible to avoid the concentration of stress added to the semiconductor layer 15, and to prevent the semiconductor layer 15 from cracking.

At the crossing part of the center line c and an extension line of the semiconductor layer 15 in a face direction, the insulating layer 18 is provided as a layer having a rigidity lower than the rigidity of the semiconductor layer 15. The insulating layer 18 is a resin layer more flexible than the semiconductor layer 15 and a metal. That is, near the center line c where the stress is liable to concentrate, the resin layer 25 and the insulating layer 18 including a resin is provided. That is, since the resin more flexible than the semiconductor layer 15 and the metal is provided at a part where the stress is liable to concentrate, the resin absorbs the stress, and thus a high stress relaxation effect can be obtained. As the result, the reliability of the chip 3 can be enhanced.

Moreover, the metal pillar is provided on the light emitting region of all the chips 3. Accordingly, the heat of the light emitting region of respective chips 3 can be discharged to the mounting substrate side through the metal pillar provided on the light emitting region.

The heat of the light emitting region of the left end chip 3 in FIG. 9 is discharged through the p-side electrode 16, the inorganic insulating film 61, the n-side wiring layer 22 and the n-side metal pillar 24. The heat of the light emitting region of the middle two chips 3 in FIG. 9 is discharged through the p-side electrode 16, the inorganic insulating film 61, the wiring layer 62 and the metal pillar 63. The heat of the light emitting region of the right end chip 3 in FIG. 9 is discharged through the p-side electrode 16, the p-side wiring layer 21 and the p-side metal pillar 23.

As an insulating film insulating between each of the n-side wiring layer 22 and the wiring layer 62, and the p-side electrode 16, the inorganic insulating film 61 is used. The inorganic material has a thermal conductivity higher than the thermal conductivity of organic materials (resin materials). Between the p-side electrode 16 and the metal pillar, no organic material is interposed. Accordingly, in the embodiment, the heat releasing properties from the light emitting region to the metal pillar can be enhanced.

Fifth Embodiment

Figure 10:
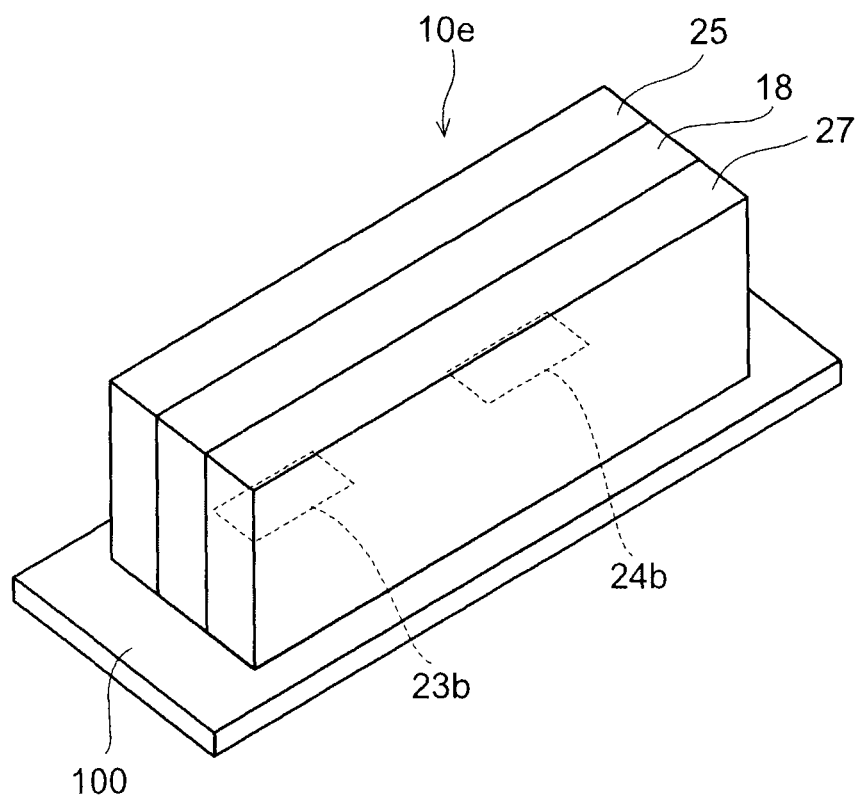
FIG. 10 is a schematic cross-sectional view of a semiconductor light emitting module of a fifth embodiment.

FIG. 10 is a schematic perspective view of a light emitting module of a fifth embodiment. The light emitting module has a structure in which a semiconductor light emitting device 10e is mounted on the mounting substrate 100.

The semiconductor light emitting device 10e has a configuration similar to the configuration of the semiconductor light emitting device 10a in the first embodiment explained with reference to FIG. 1A. The semiconductor light emitting device 10e and the semiconductor light emitting device 10a are different in face orientation of the mounting face relative to the first face 15a being the main emitting face of light.

The p-side external terminal 23b and the n-side external terminal 24b of the semiconductor light emitting device 10e shown in FIG. 10 is exposed from the resin layer 25 in a third face different in the face orientation from the aforementioned first face 15a and second face of the semiconductor layer 15.

The third face corresponds to the face on the front side of the paper or on the rear side of the paper in the semiconductor light emitting device 10a shown in FIG. 1A, and is a face approximately perpendicular to the first face 15a. That is, one side face of the p-side metal pillar 23 becomes the p-side external terminal 23b of the semiconductor light emitting device 10e shown in FIG. 10, and one side face of the n-side metal pillar 24 becomes the n-side external terminal 24b of the semiconductor light emitting device 10e shown in FIG. 10. The faces other than the p-side external terminal 23b and the n-side external terminal 24b in the metal pillars 23 and 24 are covered with the resin layer 25.

The semiconductor light emitting device 10e is mounted in an attitude in which the third face faces the mounting face of the mounting substrate 100. Each of the p-side external terminal 23b and the n-side external terminal 24b exposed through the third face is to be joined to the pad formed on the mounting face of the mounting substrate 100 via a solder.

The third face is approximately perpendicular to the first face 15a. Accordingly, in an attitude in which the third face faces the lower mounting face side, the first face 15a faces the lateral direction, instead of the upper side of the mounting face. That is, the semiconductor light emitting device 10e and the light emitting module using the device are of a so-called side view type in which light is emitted in a direction parallel to the mounting face or in an inclined direction.

Meanwhile, semiconductor light emitting devices of embodiments other than the first embodiment becomes of a side view type by exposing the external terminal by the third face.

Sixth Embodiment

FIGS. 11A to 13B are schematic plan views showing a manufacturing method of a semiconductor light emitting device of a sixth embodiment. FIGS. 11A to 13B are plan views of the second face side (the mounting face side) of the chip 3 viewed from the opposite side of the substrate.

Figure 11A:
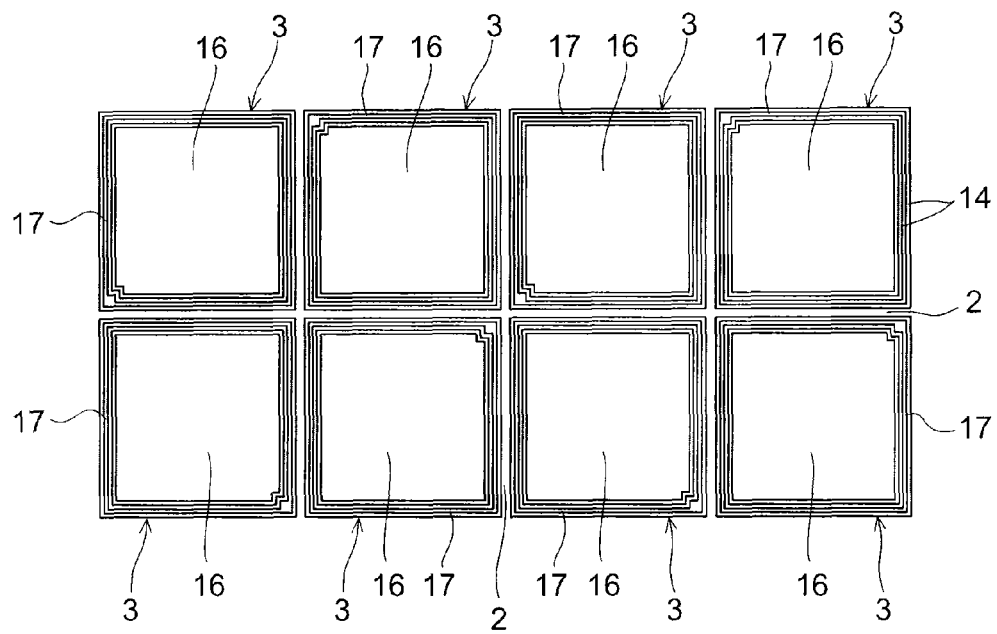
FIGS. 11A to 13B are schematic plan views showing a manufacturing method of a semiconductor light emitting device of a sixth embodiment.

FIGS. 11A to 13B shows a plan view of one semiconductor light emitting device, and the one semiconductor light emitting device includes a plurality of chips 3. For example, as shown in FIG. 11A, one semiconductor light emitting device includes eight chips 3. A plurality of chips 3 are separated from one another by the trench 2. Each of the chips 3 has, in the same manner as in the aforementioned embodiment, the semiconductor layer 15, the p-side electrode 16 and the n-side electrode 17.

In the same manner as in the aforementioned embodiment, on the main face of the substrate, the first semiconductor layer 11 is formed, and, on the layer 11, the second semiconductor layer 12 including the light emitting layer 12a is formed. And, a part of the second semiconductor layer 12 is removed and a part of the first semiconductor layer 11 is exposed.

Next, on the surface of the second semiconductor 12, the p-side electrode 16 is formed, and on the face of the exposed first semiconductor layer 11, the n-side electrode 17 is formed.

In the example shown in FIG. 11A, the p-side electrode 16 and the second semiconductor layer 12 under it occupy almost all the second face in the chip 3. The exposed part of the first semiconductor layer 11 surrounds the periphery of the second semiconductor layer 12, and, accordingly, the n-side electrode 17 surrounds the periphery of the p-side electrode 16.

The insulating film 14 is provided between the p-side electrode 16 and the n-side electrode 17. Furthermore, the periphery of the n-side electrode 17 is also covered with the insulating film 14.

After forming the p-side electrode 16 and the n-side electrode 17, for example, by an RIE method using a resist (not shown) as a mask, the trench 2 reaching the substrate is formed. The trench 2 is formed, for example, in a lattice-like planar layout on the substrate in a wafer state. The process of forming the trench 2 may be performed before forming the p-side electrode 16 and the n-side electrode 17.

Figure 11B:
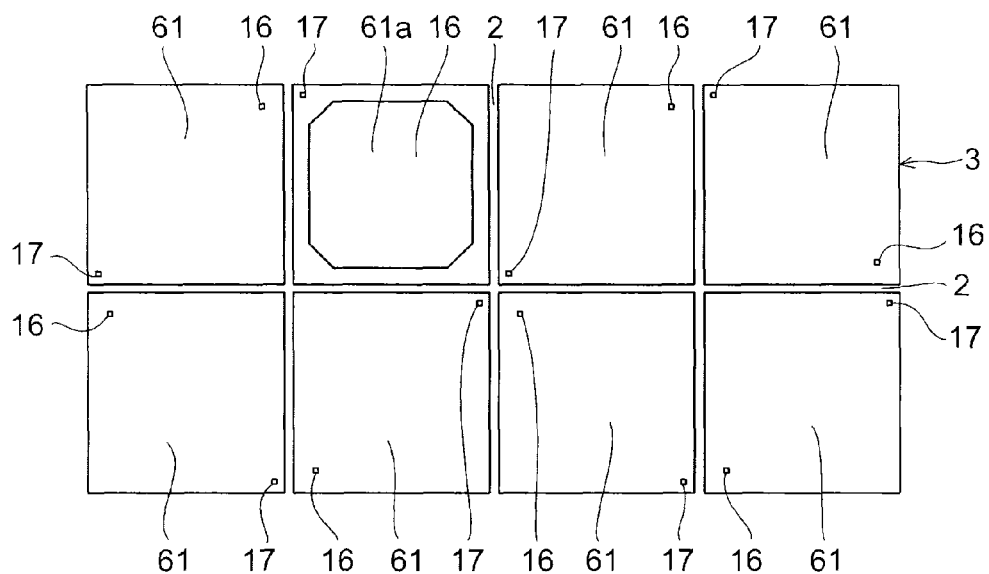

Next, on the p-side electrode 16 and the n-side electrode 17, as shown in FIG. 11B, a silicon nitride film is formed as the inorganic insulating film 61. Alternatively, a silicon oxide film may be used as the inorganic insulating film 61.

Although the inorganic insulating film 61 covers almost all the p-side electrode 16 and the n-side electrode 17, at a corner part in a plan view of respective chips 3, a part of the p-side electrode 16 and a part of the n-side electrode 17 are exposed from the inorganic insulating film 61.

Moreover, in one chip 3 among a plurality of chips 3 (the chip 3 positioned on the second upper side from the left in FIG. 11B), a broad opening (or a first via) 61a is formed in the inorganic insulating film 61, and through the opening 61a, most of the p-side electrode 16 is exposed from the inorganic insulating film 61.

Figure 12A:
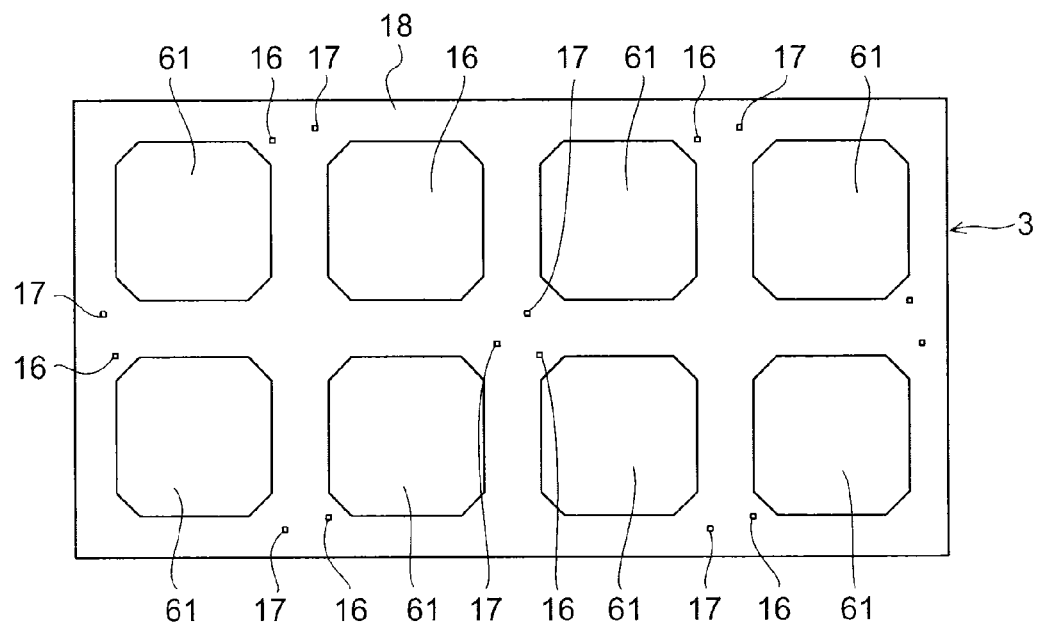

Next, in the trench 2, as shown in FIG. 12A, the insulating layer 18 is embedded. In addition, the insulating layer 18 covers a part of the surface of the inorganic insulating film 61 around the trench 2. On the second face side of respective chips 3, most region of the inside from the peripheral part provided with the n-side electrode 17 is not covered with the insulating layer 18, but the inorganic insulating film 61 is exposed in the region.

Moreover, the part of the p-side electrode 16 and the part of the n-side electrode 17 exposed from the inorganic insulating film 61 are also not covered with the insulating layer 18, but are exposed from the insulating layer 18.

Next, after forming a metal film (not shown), for example, by a sputtering method, on the metal film, a resist is formed selectively, and Cu electrolytic plating is performed using the metal film as a current pathway.

Figure 12B:
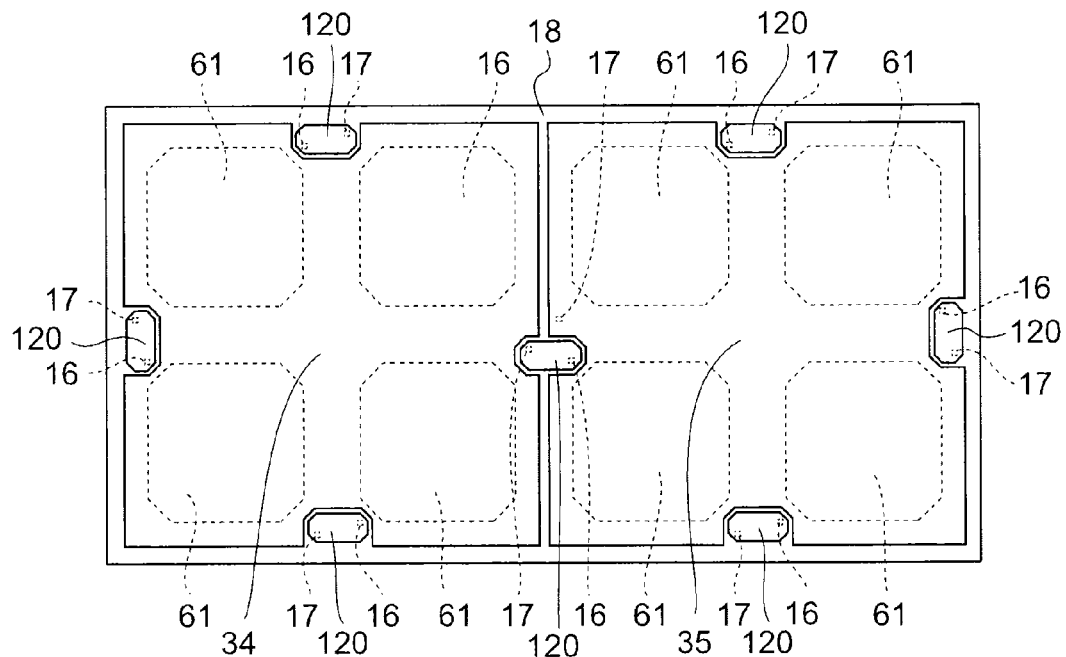

As the result, on the inorganic insulating film 61 and the insulating layer 18, as shown in FIG. 12B, the p-side wiring layer 34, the n-side wiring layer 35 and a wiring layer 120 are formed. The p-side wiring layer 34, the n-side wiring layer 35 and the wiring layer 120 are formed simultaneously with the same material in the same layer.

The p-side wiring layer 34, the n-side wiring layer 35 and the wiring layer 120 are separated mutually. Between the p-side wiring layer 34 and the n-side wiring layer 35, between the p-side wiring layer 34 and the wiring layer 120, and between the n-side wiring layer 35 and the wiring layer 120, a resin layer is provided in a subsequent process.

The p-side wiring layer 34 is provided extending on a region including a plurality of chips 3. In the example shown in FIG. 12B, the p-side wiring layer 34 is provided extending on the region including the left four chips 3. The p-side wiring layer 34 is connected to the p-side electrode 16 exposed from the inorganic insulating film 61 and the insulating layer 18 with a broad area in the chip 3 positioned on the second upper side from the left in FIG. 12A.

The n-side wiring layer 35, too, is provided extending on a region including a plurality of chips 3. In the example shown in FIG. 12B, the n-side wiring layer 35 is provided extending on the region including the right four chips 3. The n-side wiring layer 35 is connected to the n-side electrode 17 exposed from the inorganic insulating film 61 and the insulating layer 18 at a corner part in the chip 3 positioned on the second upper side from the right in FIG. 12A.

The adjacent chips 3 are electrically connected by the wiring layer 120. The wiring layer 120 is provided on adjacent corner parts between adjacent chips 3. The wiring layer 120 is connected to a part of the p-side electrode 16 exposed at a corner part of one chip 3 in the adjacent chips 3, and to a part of the n-side electrode 17 exposed at a corner part of the other chip 3.

The mounting face side shown in FIG. 12B in the semiconductor light emitting device has, for example, a rectangular planar shape. In one region dividing the longitudinal direction of the rectangle in two (the left side region in FIG. 12B), the p-side wiring layer 34 extends, and in the other region (the right side region in FIG. 12B), the n-side wiring layer 35 extends. The p-side wiring layer 34 and the n-side wiring layer 35 have an approximately the same area each other.

Figure 13A:
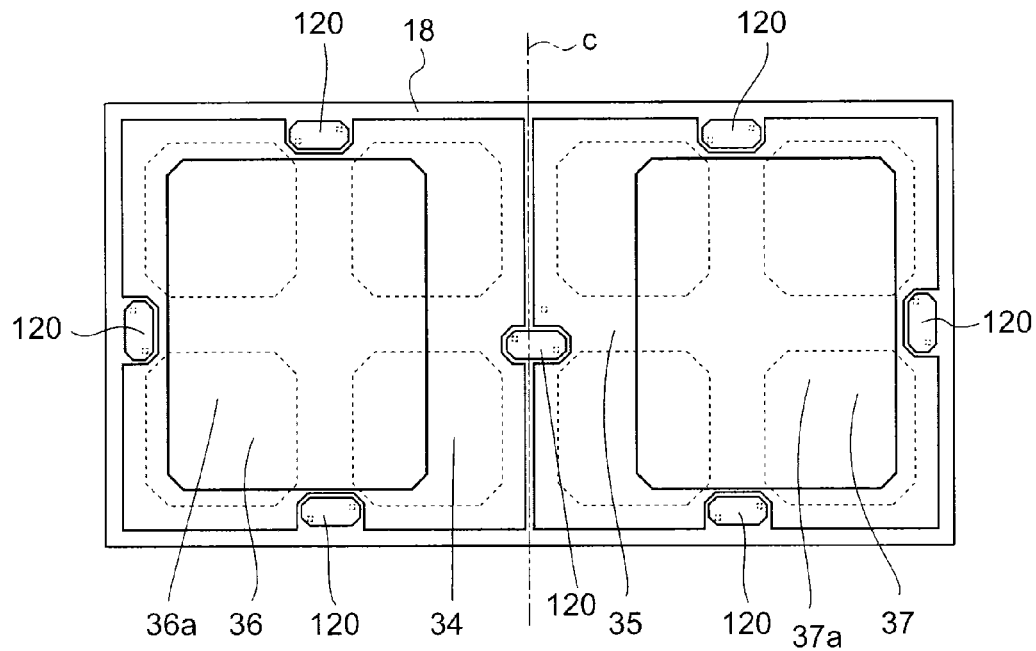

Next, Cu electrolytic plating using a resist (not shown) as a mask is performed. As the result, as shown in FIG. 13A, the p-side metal pillar 36 is provided on the p-side wiring layer 34, and the n-side metal pillar 37 is provided on the n-side wiring layer 35.

In the p-side metal pillar 36, the face opposite to the p-side wiring layer 34 functions as the p-side external terminal 36a. In the n-side metal pillar 37, the face opposite to the n-side wiring layer 35 functions as the n-side external terminal 37a.

On the periphery of the p-side metal pillar 36 and on the periphery of the n-side metal pillar 37, a resin layer is provided, and the resin layer covers the side face of the p-side metal pillar 36 and the side face of the n-side metal pillar 37. The p-side external terminal 36a and the n-side external terminal 37a are exposed from the resin layer.

The p-side external terminal 36a and the n-side external terminal 37a are joined to the aforementioned pad 101 formed on the mounting face of the mounting substrate 100 via a solder 100.

The p-side metal pillar 36 is provided in a region including a plurality of chips 3 on the p-side wiring layer 34. In the example shown in FIG. 13A, the p-side metal pillar 36 is provided on the region including the left four chips 3. In the region, only one metal pillar is provided, and in the region, the p-side metal pillar 36 is not divided but is provided in a series.

The n-side metal pillar 37 is provided in a region including a plurality of chips 3 on the n-side wiring layer 35. In the example shown in FIG. 13A, the n-side metal pillar 37 is provided on the region including the right four chips 3. In the region, only one metal pillar is provided, and in the region, the n-side metal pillar 37 is not divided but is provided in a series.

That is, in one semiconductor light emitting device, each one p-side external terminal 36a and n-side external terminal 37a are provided. Each of the p-side external terminal 36a and the n-side external terminal 37a is provided on the region including a plurality of chips 3, not divided but in a series.

The p-side external terminal 36a and the n-side external terminal 37a are formed in the same shape with the same area, and are laid out symmetrically relative to a line bisecting the longitudinal direction of the semiconductor light emitting device. Therefore, the inclination and rotation of the chip, at the time of the mounting, on the mounting substrate via solder can be suppressed.

In FIG. 13A, a dashed one-dotted line shows the center line c passing through the middle point between the p-side external terminal 36a and the n-side external terminal 37a. The center line c bisects the part between the p-side external terminal 36a and the n-side external terminal 37a in the direction connecting between the terminals 36a and 37a. In addition, the center line c is perpendicular to a line joining the p-side external terminal 36a and the n-side external terminal 37a, and to the light emitting face of the light emitting layer. The center line c is positioned between the left four chips 3 and the right four chips 3 in FIG. 13A. The center line c is positioned on the trench 2 separating the chips 3, and no semiconductor layer 15 is provided on the center line c.

Accordingly, also in the embodiment, no semiconductor layer 15 exists on the center line c between the p-side external terminal 36a and the n-side external terminal 37a on which the aforementioned stress is liable to concentrate. Accordingly, it is possible to avoid the concentration of stress added to the semiconductor layer 15, and to prevent the semiconductor layer 15 from cracking.

Moreover, in one semiconductor light emitting device of the multi-chip structure including a plurality of chips 3, only one p-side and only one n-side external terminals are provided. Although only one p-side external terminal 36a is provided, the p-side external terminal 36a is formed not divided but continuously over a broad region including a plurality of chips 3. In the same manner, although only one n-side external terminal 37a is provided, the n-side external terminal 37a is formed not divided but continuously over a broad region including a plurality of chips 3.

Since each of the external terminals 36a and 37a is not divided, the place to which the tensile stress is added can be limited to a place only between the p-side external terminal 36a and n-side external terminal 37a.

Moreover, since the p-side wiring layer 34 and the n-side wiring layer 35 are formed over a broad region including a plurality of chips 3, the planar size of the p-side metal pillar 36 and the n-side metal pillar 37 provided on the p-side wiring layer 34 and the n-side wiring layer 35, respectively, can be made large. Accordingly, the area of the p-side external terminal 36a and the n-side external terminal 37a can be made broad. As the result, heat releasing properties of the light emitting layer toward the mounting substrate side through the p-side external terminal 36a and the n-side external terminal 37a can be enhanced. Furthermore, the junction strength between the p-side external terminal 36a and the n-side external terminal 37a, and the pad 101 is enhanced, and thus the reliability is increased.

Furthermore, between the p-side electrode 16 and the p-side wiring layer 34, the inorganic insulating film 61 is provided in contact with the p-side electrode 16 and the p-side wiring layer 34. Moreover, also between the p-side electrode 16 and the n-side wiring layer 35, the inorganic insulating film 61 is provided in contact with the p-side electrode 16 and the n-side wiring layer 35.

The heat of the light emitting region can be released to the mounting substrate side through the p-side electrode 16, the inorganic insulating film 61, the wiring layer and the metal pillar provided on the light emitting region. And, since the inorganic material has a thermal conductivity higher than the thermal conductivity of organic materials (resin materials), the heat releasing properties through the heat releasing path can be enhanced.

Figure 13B:
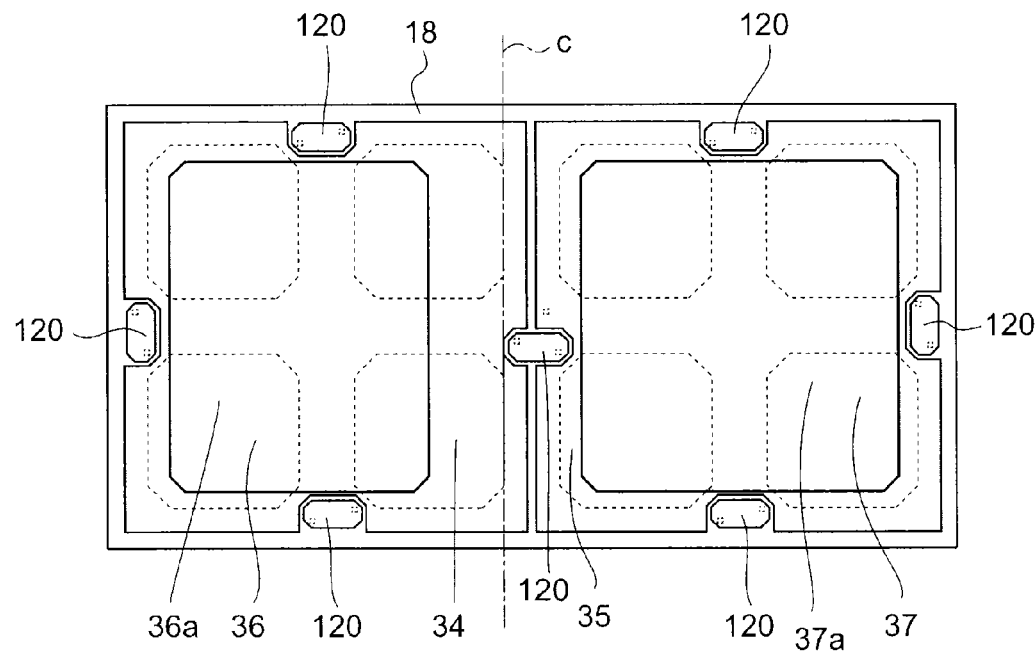

The center line c passing through the middle point between the p-side external terminal 36a and the n-side external terminal 37a may be positioned, as shown in FIG. 13B, on the chip 3. Even in the case, since each of the external terminals 36a and 37a is not divided, the increase in the place to which the tensile stress is added is not caused.

In the aforementioned embodiment, the substrate 5 used for forming the semiconductor layer 15 may not be removed but be left on the first face 15a. On this occasion, even when the metal pillar and the resin layer are not provided, the substrate 5 can support stably the chip 3.

The substrate 5 is, for example, a sapphire substrate, and has the permeability to light emitted from a nitride-based light emitting layer. If the fluorescent body layer 27 is not provided, light having a wavelength the same as the wavelength of the light emitted from the light emitting layer is emitted to the outside. Naturally, the fluorescent body layer 27 may be formed on the substrate 5.

If the metal pillar is not provided, a part of the wiring layer can be set to the external terminal by being exposed. Also on this occasion, by not providing the semiconductor layer 15 on the center line passing through the middle point between adjacent external terminals, but providing resin, it is possible to avoid the concentration of stress added to the semiconductor layer 15, and to prevent the semiconductor layer 15 from cracking.

As the above described fluorescent body layer, a red fluorescent body layer, yellow fluorescent body layer, a green fluorescent body layer, or a blue fluorescent body layer to be illustrated below, can be used.

The red fluorescent body layer can contain, for example, a nitride-based fluorescent body CaAlSiN$_3$:Eu or a SiAlON-based fluorescent body.

When the SiAlON-based fluorescent body is used, in particular $$(M_{1-x}, R_x)_{a1}AlSi_{b1}O_{c1}N_{d1} \quad \text{composition formula (1)}$$

(Here, M is at least one kind of metal element excluding Si and Al, and in particular, at least either one of Ca and Sr is desirable. R is a light emission center element and in particular, Eu is desirable. x, a1, b1, c1, and d1 satisfy the following relationship. x is larger than 0 and 1 or less, a1 is larger than 0.6 and less than 0.95, b1 is larger than 2 and less than 3.9, c1 is larger than 0.25 and less than 0.45, and d1 is larger than 4 and less than 5.7) can be used.

By using the SiAlON-based fluorescent body expressed by composition formula (1), it is possible to improve the temperature characteristics of the wavelength conversion efficiency and further improve the efficiency in a large current density region.

The yellow fluorescent body layer can contain, for example, a silicate-based fluorescent body (Sr, Ca, Ba)$_2$SiO$_4$: Eu.

The green fluorescent body layer can contain, for example, a halophosphoric acid-based fluorescent body (Ba, Ca, Mg)$_{10}$(PO$_4$)$_6$Cl$_2$:Eu or a SiAlON-based fluorescent body.

When the SiAlON-based fluorescent body is used, in particular, $$(M_{1-x}, R_x)_{a2}AlSi_{b2}O_{c2}N_{d2} \quad \text{composition formula (2)}$$

(Here, M is at least one kind of metal element excluding Si and Al, and in particular, at least either one of Ca and Sr is desirable. R is a light emission center element and in particular, Eu is desirable. x, a2, b2, c2, and d2 satisfy the following relationship. x is larger than 0 and 1 or less, a2 is larger than 0.93 and less than 1.3, b2 is larger than 4.0 and less than 5.8, c2 is larger than 0.6 and less than 1, and d2 is larger than 6 and less than 11) can be used.

By using the SiAlON-based fluorescent body represented by composition formula (2), it is possible to improve the temperature characteristics of the wavelength conversion efficiency and further improve the efficiency in a large current density region.

The blue fluorescent body layer can contain, for example, an oxide-based fluorescent body BaMgAl$_{10}$O$_{17}$: Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a plurality of chips, each of the chips including a semiconductor layer having a first face, a second face opposite to the first face, and a light emitting layer, a p-side electrode provided on the second face, and an n-side electrode provided on the second face, each of the chips being separated from each other;
   a first insulating layer provided between the plurality of chips;
   a first wiring part connected to a p-side electrode of a first chip, the first wiring part having a first p-side external terminal; and
   a second wiring part connected to a n-side electrode of a second chip, the second wiring part having an n-side external terminal, wherein
   an external terminal connected to a n-side electrode of the first chip is not provided on the first chip, and an external terminal connected to a p-side electrode of the second chip is not provided on the second chip.

2. The device according to claim 1, wherein
   the first insulating layer is provided also on the p-side electrode and the n-side electrode,
   the p-side wiring part including the first wiring part is provided on the first insulating layer, and is electrically connected to the p-side electrode, and
   the n-side wiring part including the second wiring part is provided on the first insulating layer, and is electrically connected to the n-side electrode.

3. The device according to claim 1, wherein the first insulating layer includes a resin.

4. The device according to claim 1, wherein the first insulating layer covers a side face continuing from the first face of the chip.

5. The device according to claim 2, further comprising a second insulating layer provided between the p-side wiring part and the n-side wiring part.

6. The device according to claim 5, wherein the second insulating layer covers a periphery of the p-side wiring part and a periphery of the n-side wiring part.

7. The device according to claim 5, wherein the second insulating layer includes a resin.

8. The device according to claim 2, wherein
   the p-side wiring part has a p-side wiring layer provided on the first insulating layer, and a p-side metal pillar provided on the p-side wiring layer, the p-side metal pillar being thicker than the p-side wiring layer and including the p-side external terminal; and
   the n-side wiring part has an n-side wiring layer provided on the first insulating layer, and an n-side metal pillar provided on the n-side wiring layer, the n-side metal pillar being thicker than the n-side wiring layer and including the n-side external terminal.

9. The device according to claim 8, wherein an area of the n-side wiring layer is broader than an area of the n-side electrode.

10. The device according to claim 2, wherein the p-side wiring part is connected to the p-side electrode via a plurality of first vias penetrating the first insulating layer.

11. A semiconductor light emitting device comprising:
    a plurality of chips, each of the chips including a semiconductor layer having a first face, a second face opposite to the first face, and a light emitting layer, a p-side electrode provided on the second face, and an n-side electrode provided on the second face, each of the chips being separated from each other;
    a first insulating layer provided between the chips;
    a p-side external terminal continuously provided on the plurality of chips; and
    an n-side external terminal continuously provided on the plurality of chips.

12. The device according to claim 2, wherein the n-side wiring part or the p-side wiring part is provided on each of the plurality of chips.

13. The device according to claim 12, wherein the n-side wiring part and the p-side wiring part are not provided on a region between the chips.

14. The device according to claim 1, further comprising:
an inorganic insulating film provided on the p-side electrode; and
a metal pillar provided on the inorganic insulating film, wherein the metal pillar has an external terminal provided in the same plane as the first p-side external terminal and the n-side external terminal.

15. The device according to claim 14, wherein any of the first p-side external terminal, the n-side external terminal and the metal pillar is provided on each of the plurality of chips.

16. The device according to claim 15, wherein the metal pillar is not provided on a region between the chips.

17. A semiconductor light emitting device comprising:
a plurality of chips, each of the chips including a semiconductor layer having a first face, a second face opposite to the first face, and a light emitting layer, a p-side electrode provided on the second face, and an n-side electrode provided on the second face, each of the chips being separated from each other;
an insulating layer provided on the second face side;
a p-side wiring layer continuously provided on the plurality of the chips via the insulating layer, the p-side wiring layer being electrically connected to the p-side electrode;
an n-side wiring layer continuously provided on the plurality of the chips via the insulating layer, the n-side wiring layer being electrically connected to the n-side electrode;
a p-side external terminal continuously provided on the p-side wiring layer on the plurality of the chips; and
an n-side external terminal continuously provided on the n-side wiring layer on the plurality of the chips.

18. The device according to claim 17, wherein the insulating layer has an inorganic insulating film being provided between the p-side electrode and the p-side wiring layer and contacting the p-side electrode and the p-side wiring layer, and being provided between the p-side electrode and the n-side wiring layer and contacting the p-side electrode and the n-side wiring layer.

19. A light emitting module comprising:
a mounting substrate having a pad on a mounting face; and
the semiconductor light emitting device according to claim 1 mounted on the mounting face by joining the first p-side external terminal and the n-side external terminal to the pad.

20. The device according to claim 1, further comprising:
a first wiring layer provided on the first insulating layer, the first wiring layer including a first portion connected to the n-side electrode of the first chip and a second portion connected to a p-side electrode of another chip; and
a second wiring layer provided on the first insulating layer, the second wiring layer including a third portion connected to the p-side electrode of the second chip and a fourth portion connected to an n-side electrode of another chip.

21. The device according to claim 1, further comprising:
a third wiring part provided on the p-side electrode of another chip,
an inorganic insulating film interposed between the third wiring part and the p-side electrode of the another chip, the third wiring part having a second p-side external terminal, wherein
the n-side electrode of the first chip is electrically connected to the p-side electrode of the second chip via the another chip.

22. The device according to claim 21, wherein the second wiring part is provided on the p-side electrode of the second chip, the inorganic insulating film is interposed between the second wiring part and the p-side electrode of the second chip.

23. The device according to claim 1, wherein the second wiring part is provided on the p-side electrode of the second chip, the first insulating layer is interposed between the second wiring part and the p-side electrode of the second chip.

24. The device according to claim 11, wherein
the first insulating layer is provided also on the p-side electrode and the n-side electrode,
a p-side wiring part including the p-side external terminal is provided on the first insulating layer, and is electrically connected to the p-side electrode, and
an n-side wiring part including the n-side external terminal is provided on the first insulating layer, and is electrically connected to the n-side electrode.

25. The device according to claim 11, wherein the first insulating layer includes a resin.

26. The device according to claim 11, wherein the first insulating layer covers a side face continuing from the first face of the chip.

27. The device according to claim 24, further comprising a second insulating layer provided between the p-side wiring part and the n-side wiring part.

28. The device according to claim 27, wherein the second insulating layer covers a periphery of the p-side wiring part and a periphery of the n-side wiring part.

29. The device according to claim 27, wherein the second insulating layer includes a resin.

30. The device according to claim 11, further comprising a wiring layer provided on the first insulating layer, and connecting the p-side electrode and the n-side electrode between the chips adjacent to each other.

31. The device according to claim 24, wherein
the p-side wiring part has
a p-side wiring layer provided on the first insulating layer, and
a p-side metal pillar provided on the p-side wiring layer, the p-side metal pillar being thicker than the p-side wiring layer and including the p-side external terminal; and
the n-side wiring part has
an n-side wiring layer provided on the first insulating layer, and
an n-side metal pillar provided on the n-side wiring layer, the n-side metal pillar being thicker than the n-side wiring layer and including the n-side external terminal.

32. The device according to claim 31, wherein an area of the n-side wiring layer is broader than an area of the n-side electrode.

33. The device according to claim 24, wherein the p-side wiring part is connected to the p-side electrode via a plurality of first vias penetrating the first insulating layer.

34. The device according to claim 24, wherein the n-side wiring part or the p-side wiring part is provided on each of the plurality of chips.

35. The device according to claim 34, wherein the n-side wiring part and the p-side wiring part are not provided on a region between the chips.

36. The device according to claim 11, further comprising:
an inorganic insulating film provided on the p-side electrode; and
a metal pillar provided on the inorganic insulating film, wherein the metal pillar has an external terminal provided in the same plane as the p-side external terminal and the n-side external terminal.

37. The device according to claim 36 wherein any of the p-side external terminal, the n-side external terminal and the metal pillar is provided on each of the plurality of chips.

38. The device according to claim 37, wherein the metal pillar is not provided on a region between the chips.

39. A light emitting module comprising:
a mounting substrate having a pad on a mounting face; and
the semiconductor light emitting device according to claim 11 mounted on the mounting face by joining the p-side external terminal and the n-side external terminal to the pad.

* * * * *